(12) United States Patent
Saido et al.

(10) Patent No.: US 8,882,923 B2
(45) Date of Patent: Nov. 11, 2014

(54) SUBSTRATE PROCESSING APPARATUS AND METHOD OF MANUFACTURING SEMICONDUCTOR DEVICE

(71) Applicant: Hitachi Kokusai Electric Inc., Tokyo (JP)

(72) Inventors: Shuhei Saido, Toyama (JP); Takatomo Yamaguchi, Toyama (JP); Daisuke Hara, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 15 days.

(21) Appl. No.: 13/659,267

(22) Filed: Oct. 24, 2012

(65) Prior Publication Data
US 2013/0042803 A1 Feb. 21, 2013

Related U.S. Application Data

(63) Continuation of application No. PCT/JP2011/066041, filed on Jul. 14, 2011.

(30) Foreign Application Priority Data

Jul. 22, 2010 (JP) .................................. 2010-165300

(51) Int. Cl.
*C23C 16/00* (2006.01)
*C23C 16/50* (2006.01)
(Continued)

(52) U.S. Cl.
CPC ......... *C23C 16/4583* (2013.01); *H01L 21/0262* (2013.01); *H01L 21/67109* (2013.01); *H01L 21/67757* (2013.01); *C23C 16/45578* (2013.01); *H01L 21/02529* (2013.01); *C23C 16/46* (2013.01)
USPC ........................ 118/728; 118/725; 156/345.51

(58) Field of Classification Search
USPC .......... 118/715, 728–733; 156/345.51–345.55
See application file for complete search history.

(56) References Cited

U.S. PATENT DOCUMENTS 4,745,088 A * 5/1988 Inoue et al. ..................... 117/98
5,370,371 A * 12/1994 Miyagi et al. ................ 266/256
(Continued)

FOREIGN PATENT DOCUMENTS

| JP | 8017752 | 1/1996 |
| JP | 2003282452 | 10/2003 |
| JP | 2004235425 | 8/2004 |
| JP | 2007095923 | 4/2007 |

OTHER PUBLICATIONS

International Search Report in counterpart International Application No. PCT/JP2011/066041, mailed Oct. 11, 2011.

*Primary Examiner* — Parviz Hassanzadeh
*Assistant Examiner* — Tiffany Nuckols
(74) *Attorney, Agent, or Firm* — Edell, Shapiro and Finnan LLC

(57) ABSTRACT

A substrate processing apparatus includes: a process chamber having an object to be heated therein and configured to process a plurality of substrates; a substrate holder configured to hold the substrates with an interval therebetween in a vertical direction in the process chamber; a first heat exchange unit supporting the substrate holder from a lower side thereof in the process chamber and configured to perform a heat exchange with a gas in the process chamber; a second heat exchange unit provided in the process chamber, the second heat exchange unit being horizontally spaced apart from the first heat exchange unit with a gap therebetween and being configured to perform a heat exchange with the gas in the process chamber; and an induction heating unit configured to subject the object to be heated to an induction heating from an outer side of the object to be heated.

13 Claims, 19 Drawing Sheets

(51) Int. Cl.
*C23F 1/00* (2006.01)
*H01L 21/306* (2006.01)
*C23C 16/458* (2006.01)
*H01L 21/67* (2006.01)
*H01L 21/677* (2006.01)
*C23C 16/455* (2006.01)
*C23C 16/46* (2006.01)
*H01L 21/02* (2006.01)

(56) References Cited

U.S. PATENT DOCUMENTS

| | | | |
|---|---|---|---|
| 6,403,927 B1 * | 6/2002 | Kato | 219/390 |
| 2005/0056220 A1 * | 3/2005 | Aoki et al. | 118/722 |
| 2007/0235134 A1 * | 10/2007 | Iimuro | 156/345.27 |
| 2010/0162958 A1 * | 7/2010 | Kurokawa | 118/725 |

* cited by examiner

SUBSTRATE PROCESSING APPARATUS AND METHOD OF MANUFACTURING SEMICONDUCTOR DEVICE

CROSS REFERENCE TO RELATED APPLICATIONS

This application is a continuation of International Application No. PCT/JP2011/066041, filed on Jul. 14, 2011, entitled "Substrate Processing Apparatus and Method of Manufacturing Semiconductor Device," which claims priority under 35 U.S.C. §119 to Application No. JP 2010-165300 filed on Jul. 22, 2010, entitled "Substrate Processing Apparatus and Method of Manufacturing Semiconductor Device," the entire contents of which are hereby incorporated by reference.

FIELD OF THE INVENTION

The present invention relates to a substrate processing apparatus and a method of manufacturing a semiconductor device.

BACKGROUND

In the related art, a vertical substrate processing apparatus that includes a process chamber for processing a substrate inside a substrate holder (susceptor), and performs substrate processing by supplying a reaction gas while heating a plurality of substrates in the process chamber held in a vertical direction by induction-heating the susceptor has been known (for example, in Japanese Patent Laid-open Publication No. 2007-095923). The substrate processing apparatus is configured to cover the entire periphery of the process chamber by a heat insulating material in such a manner that the substrate holder for holding the substrate is supported from a lower side by a lower heat insulating material, an inner heat insulating material is provided on a horizontal peripheral edge of the lower heat insulating material, and an upper heat insulating unit is provided above the substrate holder. Therefore, since the entire periphery of the process chamber is covered with the heat insulating material, homogenization of a temperature distribution of the process chamber is promoted due to a large heat insulating effect (heat retaining effect) of the process chamber.

SUMMARY

By the way, the process chamber of the vertical substrate processing apparatus is formed inside a reaction vessel in which a reaction tube and a manifold vertically overlap. The reaction tube positioned above the process chamber is generally made of quartz, and the manifold positioned below the process chamber is generally made of a metal. A heat-resistant temperature of each member constituting the manifold may be lower than a substrate processing temperature. When the substrate processing temperature is high, radiation from a substrate region in the process chamber to the manifold is intense. In addition, since a carrier gas is needed for the substrate processing, transportation of thermal energy from the substrate region to the manifold by the carrier gas is enormous. Accordingly, as one of problems of the substrate processing apparatus, for example, an increase in temperature of the manifold may be given. To protect each member constituting the manifold, it is necessary to keep the temperature of the manifold below the heat-resistant temperature of each member.

However, in the above-described Japanese Patent Unexamined Application No. 2007-095923, the heat insulating effect may effectively prevent the radiation to the manifold, but heat transportation is not taken into account, and thus there is a possibility of the gas being released to a furnace port of the manifold in a state in which the gas is at a high temperature. For this reason, a temperature of each member of the furnace port may not be able to remain below the heat-resistant temperature, and thereby heat deterioration of the member, or the like may occur.

The present invention provides a substrate processing apparatus and a method of manufacturing a semiconductor device, which can suppress heat deterioration, or the like of a member of on a lower side of a process chamber.

According to one aspect of the present invention, there is provided a substrate processing apparatus including: a process chamber having an object to be heated therein and configured to process a plurality of substrates; a substrate holder configured to hold the plurality of substrates with an interval therebetween in a vertical direction in the process chamber; a first heat exchange unit supporting the substrate holder from a lower side thereof in the process chamber, the first heat exchange unit being configured to perform a heat exchange with a gas in the process chamber; a second heat exchange unit provided in the process chamber, the second heat exchange unit being horizontally spaced apart from the first heat exchange unit with a gap therebetween and being configured to perform a heat exchange with the gas in the process chamber; and an induction heating unit configured to subject the object to be heated to an induction heating from an outer side of the object to be heated.

According to another aspect of the present invention, there is provided a method of manufacturing a semiconductor device, including: heating a substrate holder holding a plurality of substrates with an interval therebetween in a vertical direction and supported by a first heat exchange unit in a process chamber by heating the process chamber, wherein the process chamber having an object to be heated therein is heated by induction-heating the object to be heated using an induction heating unit; and performing heat exchange with a gas in the process chamber between the first heat exchange unit and a second heat exchange unit that is provided so as to keep a gap with the first heat exchange unit in a horizontal direction while processing the plurality of substrates.

According to embodiments of the present invention, it is possible to suppress heat deterioration, or the like of a member of on a lower side of a process chamber.

DETAILED DESCRIPTION

As described above, a heat insulating effect is high in a configuration in which the entire periphery of a process chamber is coated with a heat insulating material, so that a gas is released to a lower side of the process chamber in a state in which the gas is at a high temperature. For this reason, it is difficult to maintain a temperature of each member constituting the lower side of the process chamber at a heat-resistant temperature or less. According to embodiments of the present invention, a substrate processing apparatus includes a first heat exchange unit that supports a substrate holder from the lower side of the substrate holder in the process chamber, and a second heat exchange unit that is provided on a horizontal peripheral edge of the first heat exchange unit in the process chamber to form a gap with the first heat exchange unit, and performs heat exchange with a gas in the process chamber. In this manner, by performing heat exchange with the gas in the process chamber, heat deterioration or the like of the member of the lower side of the process chamber can be suppressed by cooling a gas of a high temperature.

Next, embodiments of the present invention will be described with reference to the accompanying drawings. Here, a substrate processing apparatus that processes a silicon carbide (SiC) substrate as a substrate will be described. The silicon carbide (SiC) has a larger energy band gap and a higher dielectric strength voltage compared to silicon (Si), and thereby has attracted attention as a material of an element for a power device. An epitaxial growth temperature of silicon carbide (SiC) is 1,500° C. to 1,800° C. higher than an epitaxial growth temperature of silicon (Si) of 900° C. to 1,200° C., and thus a heat-resistant structure of the substrate processing apparatus is required to be technically devised as the substrate processing apparatus.

Substrate Processing Apparatus

Figure 4:
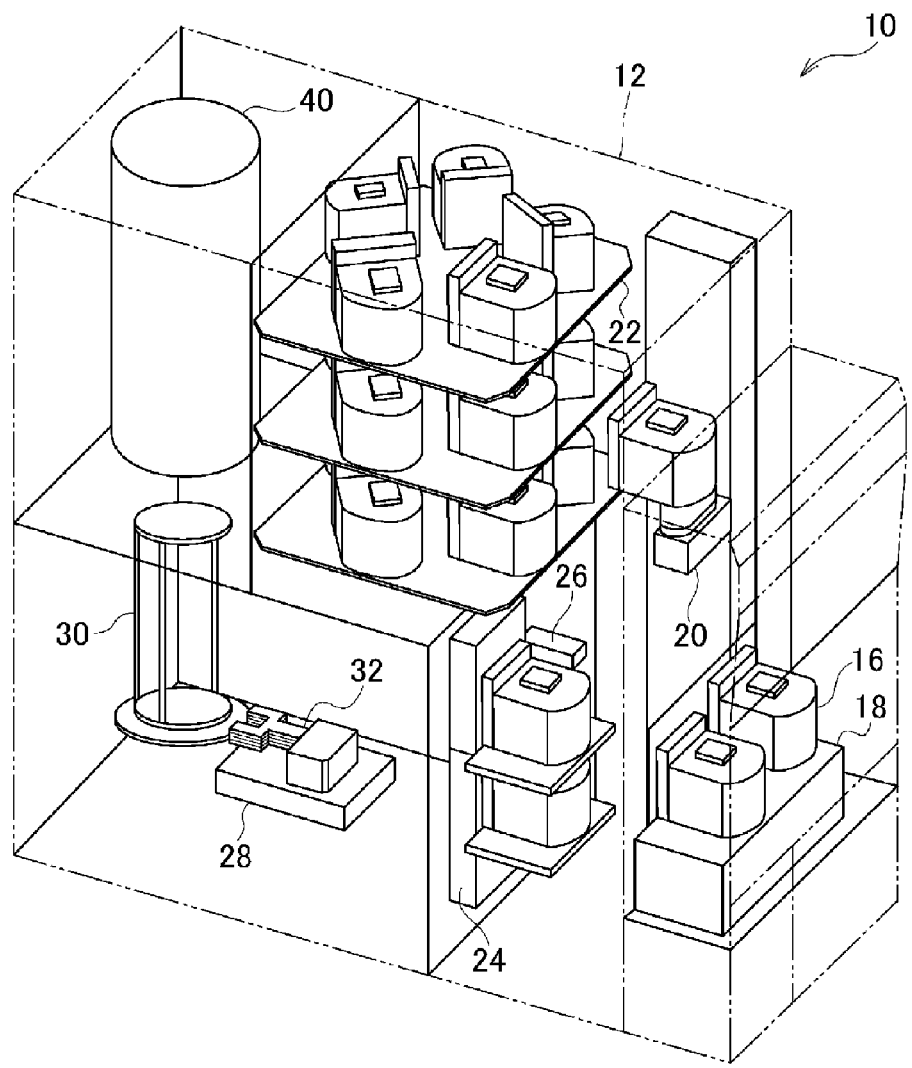
FIG. 4 is an oblique perspective view showing a substrate processing apparatus to which the first embodiment of the present invention is applied.

FIG. 4 is a perspective view showing a substrate processing apparatus 10 according to an embodiment of the present invention. The substrate processing apparatus 10 is a batch-type vertical substrate processing apparatus 10, and includes a housing in which main portions are disposed. In the substrate processing apparatus 10, a FOUP 16 (hereinafter referred to as a "pod"), which is a substrate container for containing a wafer as a substrate formed of, for example, SiC, is used as a wafer carrier. On a front side of the housing 12, a pod stage 18 is disposed, and the pod 16 is conveyed to the pod stage 18. In the pod 16, for example, twenty-five wafers are received, and are set to the pod stage 18 in a state in which a lid is closed.

In a position that is a front side in the housing 12, and faces the pod stage 18, a pod conveying device 20 is disposed. In addition, in the vicinity of the pod conveying device 20, a pod shelf 22, a pod opener 24, and a substrate number detector 26 are disposed. The pod shelf 22 is disposed above the pod opener 24, and is configured to hold the pod 16 in a state in which a plurality of pods 16 are placed on the pod shelf 22. The substrate number detector 26 is disposed adjacent to the pod opener 24. Between the pod stage 18, the pod shelf 22, and pod opener 24, the pod conveying device 20 conveys the pod 16. The pod opener 24 is used for opening the lid of the pod 16, and the substrate number detector 26 detects the number of wafers in the pod 16 with an opened lid.

In the housing 12, a substrate transfer machine 28 and a boat 30 are disposed as the substrate holder. The substrate transfer machine 28 includes an arm 32 (tweezers), and has a structure in which a vertical rotation operation is possible by a driving unit which is not shown. The arm 32 may unload, for example, five wafers, and the wafers are conveyed between the pod 16 and the boat 30 which are placed in a position of the pod opener 24 by moving the arm 32.

A processing furnace 40 is disposed in a rear side upper portion in the housing 12. A boat 30 in which a plurality of wafers are charged is loaded into the processing furnace 40 to perform heat treatment.

Processing Furnace

Figure 1:
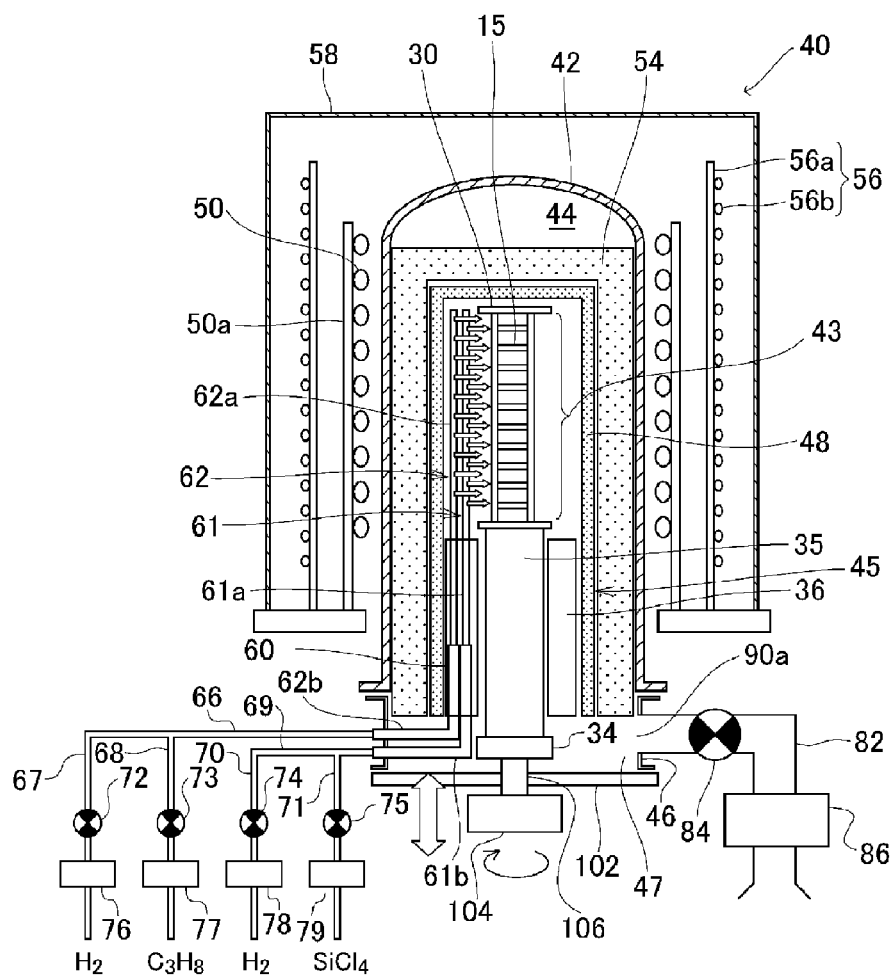
FIG. 1 is a vertical sectional view showing a processing furnace used in a first embodiment of the present invention.

The processing furnace 40 described above will be described. FIG. 1 is a vertical sectional view showing the processing furnace 40. In FIG. 1, as a gas supply unit 60, a carbon-based source supply nozzle 62 and a Si-based source supply nozzle 61 are shown as representative examples.

The processing furnace 40 includes a cylindrical reaction tube 42. The reaction tube 42 may be made of a heat-resistant material such as quartz ($SiO_2$) or silicon carbide (SiC), and formed in a cylindrical shape with a closed upper end and an opened lower end. A process chamber 44 is formed in an inner cylindrical hollow portion of the reaction tube 42, and wafers horizontally held by the boat 30 can be received while aligned in multiple stages in the vertical direction. The reaction tube 42 may have a single tube structure, and also have a double tube structure formed of an inner tube and an outer tube.

The boat 30 is configured to hold a plurality of wafers with an interval therebetween in the vertical direction in a wafer region (43, substrate region) in which a wafer (14 of FIG. 2) in the process chamber 44 is subjected to heat treatment. The wafer may be held with, for example, a predetermined interval therebetween. In the embodiment, the wafer is held by a wafer holder 15, and the boat 30 holds a plurality of wafer holders 15 in a shelf form. The boat 30 is made of a heat-resistant (1,500° C. to 1,800° C.) material such as carbon graphite whose surface is coated with SiC, silicon carbide (SiC), or the like, and the plurality of wafer holders 15 each for holding the wafer are aligned in a horizontal direction or in a state in which centers of the wafer holders 14 are arranged to thereby hold the wafer in multiple steps in the vertical direction.

Figure 2:
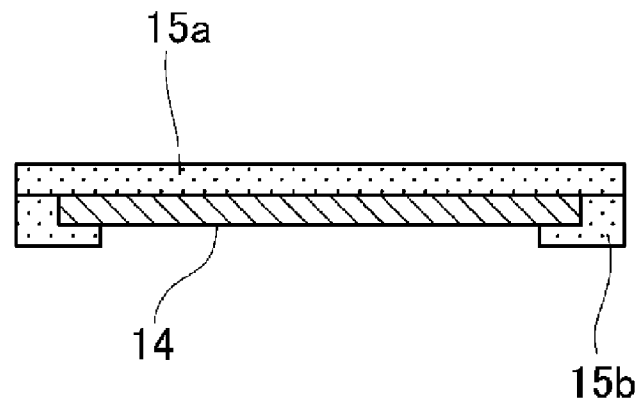
FIG. 2 is a vertical cross-sectional view showing a substrate holder used in the first embodiment of the present invention.

As shown in FIG. 2, for example, a face-down method in which a crystal growth surface (main surface or a surface) of the wafer 14 is fixed so as to be directed downward is employed for the wafer holder 15. In this method, the wafer holder 15 includes a holder lower portion 15b and a holder upper portion 15a made of carbon graphite coated with SiC. The holder upper portion 15a includes a circular plate, for example, and prevents the formation of films on a rear surface of the wafer 14 by covering the rear surface of the opposite of the crystal growth surface of the wafer 14. The holder lower portion 15b has an inner periphery thinner than an outer periphery, for example, and formed in a ring shape. Here, the wafer 14 is received in the inner periphery of the holder lower portion 15b to thereby hold the wafer 14. In addition, a groove is formed in a support of the boat 30, and the wafer holder 15 for holding the wafer 14 is transferred to the groove.

A manifold 46 is disposed on a lower side of the reaction tube 42 in a concentric shape with the reaction tube. The manifold 46 is made of, for example, a metal such as stainless or the like, and formed in a cylindrical shape having opened upper and lower ends. The manifold 46 is provided so as to support the reaction tube 42. In addition, an "O" ring is provided as a seal member between the manifold 46 and the reaction tube 42. The manifold 46 is supported by a holder which is not shown, and thus the reaction tube 42 is provided vertically. A reaction vessel is formed by the reaction tube 42 and the manifold 46. The above-described process chamber 44 is formed in the reaction vessel.

The processing furnace 40 as a substrate heating portion includes a body to be heated 48 as an object to be heated made of, for example, graphite, and an induction coil 50 as an alternating flux generator. The induction coil is supported by a coil support pillar 50a that is a support. The coil support pillar 50a is made of an insulator, for example, a ceramic material such as alumina or the like. The body to be heated 48 is provided inside the process chamber 44. The body to be heated 48, for example, is formed in a cylindrical shape so as to warp an upper portion, an outer periphery, and a lower portion of the boat 30. The cylindrical body to be heated 48 is made of carbon graphite whose surface is coated with SiC. The body to be heated 48 has a configuration in which an induction current (eddy current) flows to generate heat by an alternating magnetic field generated by the induction coil 50 provided outside the reaction tube 42. The body to be heated 48 is heated, and thereby the wafer 14 in the process chamber 44 is heated to a processing temperature. In addition, the induction coil 50 is disposed outside the process chamber 44 corresponding to the wafer region 43 inside the process chamber 44, and the wafer region 43 inside the process chamber 44 is mainly heated. The eddy current does not flow in a portion of a heat insulating region 45 of the body to be heated 48 not to be heated. Here, the heat insulating region 45 refers to a region for blocking radiation and promoting heat exchanging of gases and members.

In the vicinity of the body to be heated 48, a temperature sensor which is not shown is provided as a temperature detector for detecting a temperature in the process chamber 44. A temperature controller 52 (see, FIG. 5) is electrically connected to the induction coil 50 and the temperature sensor, and the temperature controller 52 is configured to control current supply to the induction coil 50 based on temperature information detected by the temperature sensor so as to control the current supply to the induction coil 50 at a desired timing so that the temperature in the process chamber 44 has a desired temperature distribution.

Between the body to be heated 48 and the reaction tube 42, a heat insulating material that prevents an increase in temperature of the reaction tube 42 by radiant heat radiated from the body to be heated 48, or suppresses the radiant heat from being transmitted to the outside of the reaction tube 42, for example, an inner heat insulating wall 54 made of felt-like carbon, is provided. The inner heat insulating wall 54 is provided so as to cover an upper portion and an outer periphery of the body to be heated 48, and performs heat insulating so as to prevent heat from the upper portion and the lower portion of the boat 30 from being leaked to the outside. In addition, an outer heat insulating wall 56 that has a water cooling structure for suppressing heat in the process chamber 44 from being transmitted to the outside is provided outside the induction coil 50 so as to surround the process chamber 44. The outer heat insulating wall 56 includes a water cooling plate 56a and a water cooling pipe 56b, and cools the reaction tube 42. In addition, a housing cover 58 that prevents an alternating magnetic field generated by the induction coil 50 from being leaked or prevents leakage of heat to the outside is provided outside the outer heat insulating wall 56.

Gas Supply System

Gas supply nozzles 61 and 62 are provided in the manifold 46 so as to penetrate the manifold 46 as a gas flow passage for circulating a gas in the process chamber 44. The gas supply nozzles 61 and 62 include graphite portions 61a and 62a which are disposed in the wafer region 43 and require relatively high heat-resistant properties and quartz portions 61b and 62b which are disposed in the heat insulating region 45 and require relatively low heat-resistant properties. The gas supply nozzles 61 and 62 are formed in, for example, tube shapes. Gas supply pipes 66 and 69 for supplying gases to each of the gas supply nozzles 61 and 62 are connected to the gas supply nozzles 621 and 62 penetrating the manifold 46. One gas supply pipe 66 is connected to a carrier, which is not shown, that is a gas supply source of a carbon source via valves 72 and 73 and mass flow controllers (MFCs) 76 and 77 as a gas flow rate controller in branch pipes 67 and 68 which are branched in two. The other gas supply pipe 69 is connected to a carrier, which is not shown, that is a gas supply source of a silicon source via valves 74 and 75 and MFCs 78 and 79 in branch pipes 70 and 71 which are branched in two. A gas flow rate controller 80 (see, FIG. 5) is electrically connected to the valves 72 to 75 and the MFCs 76 to 79, and is configured to control the valves 72 to 75 and the MFCs 76 to 79 at a desired timing so that a flow rate of the supplied gas becomes a desired flow rate. A supply hole for ejecting gases for each of the wafers supported by the boat 30 is provided in the gas supply nozzle 60. In addition, the supply hole may be provided in units of several wafers.

Figure 3:
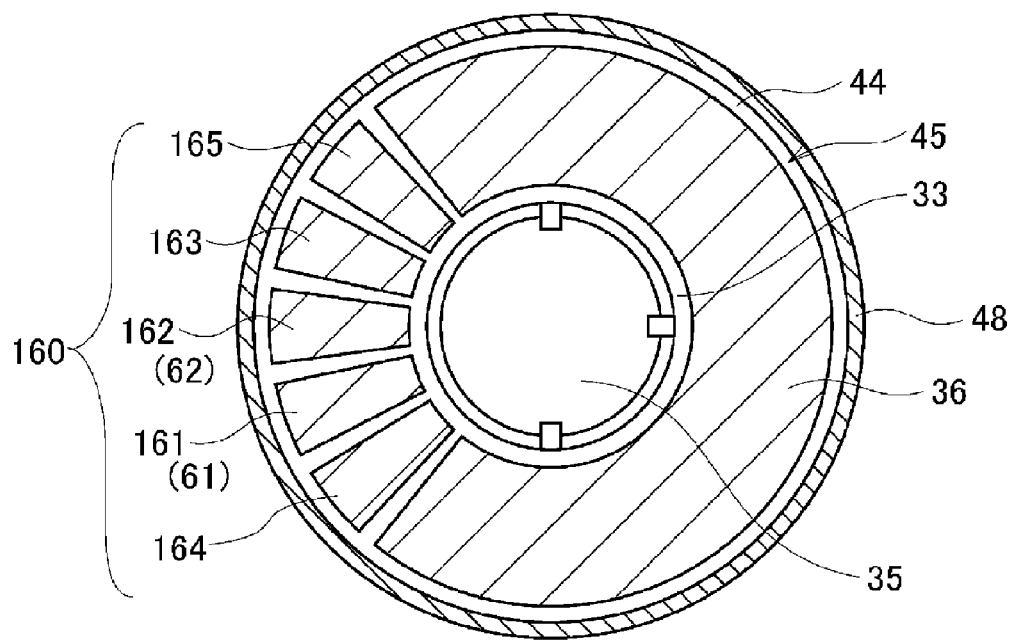
FIG. 3 is a planar cross-sectional view showing the processing furnace used in the first embodiment of the present invention.

Five gas supply units 161 to 165 including the gas supply nozzles 61 and 62 will be described in detail. The gas supply units 161 to 165 may be referred to generically as a gas supply unit 160. As shown in FIG. 3, the five gas supply units 161 to 165 are disposed inside the body to be heated 48. The gas supply unit 161 introduces a mixed gas of mono-silane ($SiH_4$) and hydrogen (carrier) as a silicon (Si) source. Otherwise, in the gas supply unit 161, hydrogen chloride (HCl) may be added, or a source such as trichlorosilane ($SiHCl_3$), tetrachlorosilane ($SiCl_4$), or the like including chlorine (Cl) in the structure may be used for the purpose of suppressing formation of silicon nucleation in a vapor phase or improving quality of crystal. The gas supply unit 162 introduces a mixed gas of hydrogen carbide and hydrogen such as propane ($C_2H_8$), ethylene ($C_2H_4$), or the like as a carbon (C) source. The gas supply unit 164 introduces, for example, nitrogen, as a dopant gas for forming an n-type doped layer. As the dopant gas, a boron compound, an aluminum compound, or the like which forms a p-type doped layer may be used.

In addition, the gas introduced by the gas supply units 161, 162, and 164 is not limited to the above, and may be appropriately changed depending on the purpose. As the silicon source, other than those described above, silicon hydride, silicon chloride, or silicon hydrogen chloride, and materials obtained by diluting these using hydrogen, argon, or the like may be used. Hereinafter, a gas used for processing (epitaxial growth) the wafer 14 in the process chamber 44 is referred to as a reaction gas.

In addition, the gas supply unit 165 introduces, for example, an inert gas such as argon or the like. In addition, the gas supply unit 163 introduces, for example, nitrogen, trimethyl aluminum (TMA), diborane ($B_2H_6$), boron trichloride ($BCl_3$), or the like as a carrier dopant gas.

The gas introduced into the process chamber 44 through the gas supply units 161 to 165 in the configuration of the processing furnace 40 is supplied through a corresponding gas supply pipe from a gas supply source (not shown), introduced into the process chamber 44 via a valve after a flow rate of the gas is adjusted by MFC, and then finally ejected between the wafers 14 though the supply hole of the gas supply unit 160.

Gas Exhaust System

In addition, as shown in FIG. 1, a gas exhaust pipe 82 connected to a gas exhaust port 90a is provided in the manifold 46 so as to penetrate the manifold 46. A vacuum exhaust device 86 such as a vacuum pump or the like is connected to a downstream side of the gas exhaust pipe 82 via a pressure sensor as a pressure detector which is not shown and an APC valve 84 as a pressure controller. A pressure controller 98 (see FIG. 5) is electrically connected to the pressure sensor and the APC valve 84, and configured to control the opening degree of the APC valve 84 at a desired timing so that the pressure in the process chamber 44 reaches a desired pressure by adjusting the opening degree of the APC valve 84 based on the pressure detected by the pressure sensor.

In this manner, the gas ejected through the supply hole of the gas supply unit 160 flows between the wafers 14 held in a horizontal posture and in multiple steps in the vertical direction when flowing toward the gas exhaust port 90a, and thus the gas flows in parallel with respect to the wafer 14, and the entire wafers 14 are effectively or evenly exposed to the gas.

Structure of Lower Portion of Processing Furnace

In a lower portion of the processing furnace 40, a seal cap 102 as a furnace port lid for airtightly closing a lower end opening of the processing furnace 40 is provided. The seal cap 102 is made of, for example, a metal such as stainless steel or the like, and formed in a disc shape. On an upper surface of the seal cap 102, an "O" ring as a seal member abutting a lower end of the processing furnace 40 is provided. In the seal cap 102, a rotation mechanism 104 is provided. A rotation shaft 106 of the rotation mechanism 104 is connected to the boat 30 so as to penetrate the seal cap 102, and rotates the wafer 14 by rotating the boat 30 during the processing so that a thickness of an epitaxial layer on the wafer becomes uniform. The seal cap 102 is configured to be vertically (arrow direction) elevated by an elevation mechanism provided outside the processing furnace 40, and thus the boat 30 may be loaded into and unloaded from the processing furnace 40. A driving controller 108 (see, FIG. 5) is electrically connected to the rotation mechanism 104 and the elevation mechanism, and the driving controller 108 is configured to control the rotation mechanism 104 and the elevation mechanism at a desired timing for performing a desired operation.

Control System

Figure 5:
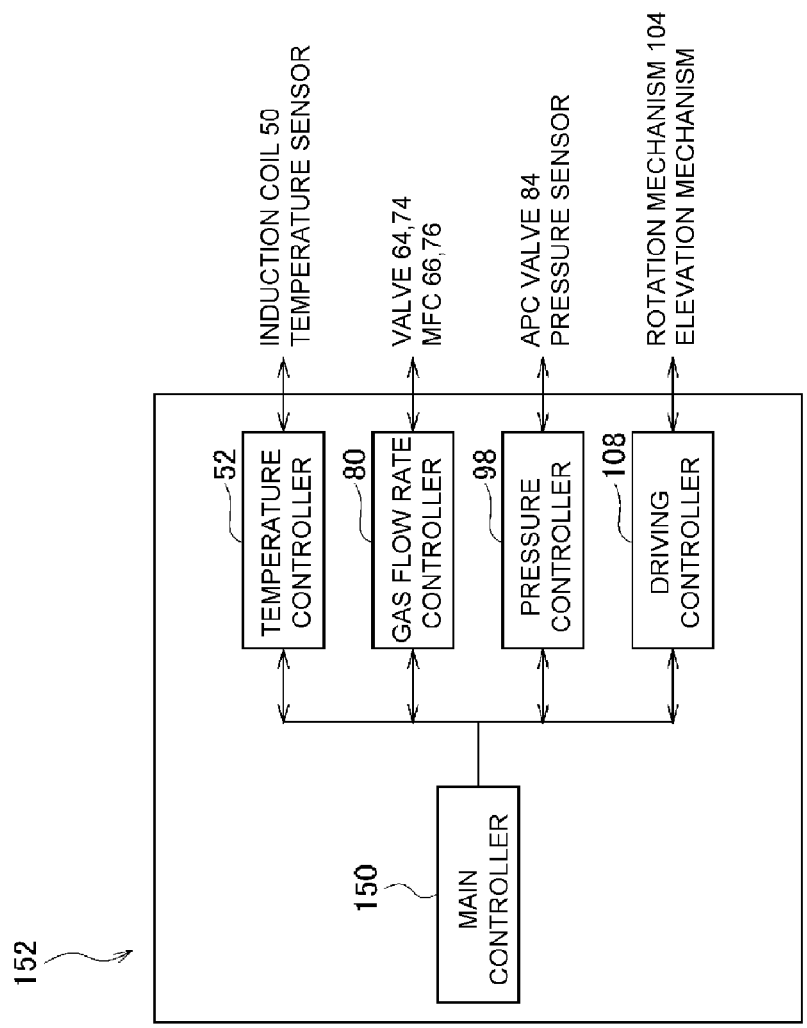
FIG. 5 is a block diagram showing a controller of the substrate processing apparatus to which the first embodiment of the present invention is applied.

FIG. 5 is a block diagram showing a control configuration of each unit constituting the substrate processing apparatus 10. The temperature controller 52, the gas flow rate controller 80, the pressure controller 98, and the driving controller 108 constitute an operation unit and an input/output unit, and are electrically connected to a main controller 150 for controlling the whole substrate processing apparatus 10. The temperature controller 52, the gas flow rate controller 80, the pressure controller 98, and the driving controller 108 are configured as a controller 152.

Method of Forming SiC Epitaxial Layer

Next, as one of processes of manufacturing a semiconductor device using the substrate processing apparatus 10, a method of forming, for example, a SiC epitaxial layer on a substrate such as a SiC wafer or the like will be described with reference to FIG. 23. Also, in the following description, operations of each unit constituting the substrate processing apparatus 10 are controlled by the controller 152.

First, when the pod 16 that receives a plurality of wafers 14 in the pod stage 18 is set, the pod 16 is conveyed to the pod shelf 22 from the pod stage 18 by the pod conveying device 20, and the conveyed pod 16 is stocked in the pod shelf 22. Next, the pod 16 stocked in the pod shelf 22 is conveyed to the pod opener 24 by the pod conveying device 20 to thereby be set, a lid of the pod 16 is opened by the pod opener 24, and then the number of wafers 14 received in the pod 16 is detected by the substrate number detector 26.

Next, the wafers 14 are removed from the pod 16 positioned at a location of the pod opener 24 by the substrate transfer machine 28, the removed wafers 14 are transferred to the boat 30, and the plurality of wafers 14 are held by the boat 30 to have an interval therebetween in the vertical direction. As the number of wafers 14 to be subjected to batch processing, for example, 25 to 100 wafers are used. Thereby, mass-producibility may be enhanced.

Figure 23:
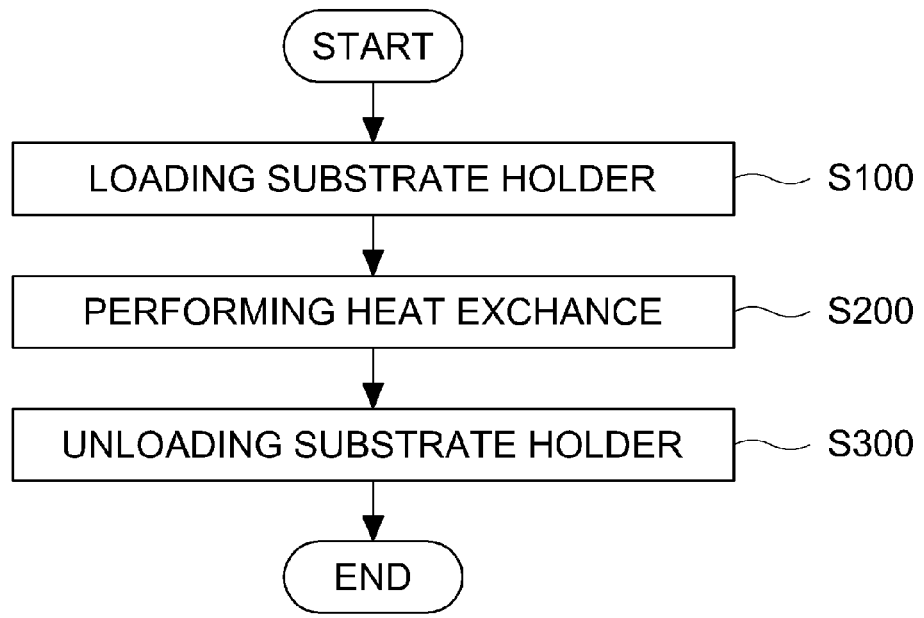
FIG. 23 is a flowchart showing a method of manufacturing a semiconductor device according to an embodiment of the present invention.

When the plurality of wafers 14 are charged on the boat 30, the boat 30 that holds the plurality of wafers 14 is loaded into (boat loading) the process chamber 44 inside the body to be heated 48 by an elevation operation (shown as an arrow) of the elevation mechanism (see, S100 of FIG. 23). In this state, the seal cap 102 seals a lower end of the manifold 46 via an "O" ring.

Vacuum exhaust is performed by the vacuum exhaust device 86 so that an inside of the process chamber 44 has a desired pressure (degree of vacuum). In this instance, the pressure in the process chamber 44 is measured using the pressure sensor, and the APC valve 84 corresponding to the gas exhaust pipe 82 is feedback-controlled based on the measured pressure. In addition, the inside of the process chamber 44 is heated so as to have a desired temperature by performing induction heating on the body to be heated 48 from the outside of the body to be heated 48 using the induction coil 50. In this instance, a state of a current applied to the induction coil 50 is feedback-controlled based on temperature information detected by the temperature sensor so that the inside of the process chamber 44 has a desired temperature distribution. Next, the wafers 14 are rotated by rotation of the boat 30 by the rotation mechanism 104.

Next, a reaction gas is supplied from a gas supply source, which is not shown, to the gas supply nozzles 61 and 62 which represent the gas supply unit 160. The opening degree of MFCs 76 to 79 corresponding to the gas supply nozzles 61 and 62 is adjusted to have a desired flow rate, the valves 72 to 75 are opened, and then each reaction gas circulates in the gas supply pipes 66 to 71 to thereby be introduced into the process chamber 44 through the supply hole. The gas introduced from the gas supply nozzles 61 and 62 passes through the inside of the body to be heated 48 in the process chamber 44, and then is exhausted using the gas exhaust pipe 82 through a gap 33 between the first heat exchange unit 35 and the second heat exchange unit 36 (see, S200 of FIG. 23). The reaction gas is brought into contact with the wafer 14 when passing through the inside of the process chamber 44, and thereby enables a SiC epitaxial layer to grow on a surface of the wafer 14.

When a predetermined time has elapsed, an inert gas is supplied from an inert gas supply source which is not shown, and thereby the inside of the process chamber 44 is replaced with the inert gas, and at the same time the pressure in the process chamber 44 returns to a normal pressure.

Thereafter, the seal cap 102 is lowered by the elevation mechanism, and thereby the lower end of the manifold 46 is opened, and at the same time the wafer 14 whose processing is completed is unloaded (boat unloading) to outside of the reaction tube 42 from the lower end of the manifold 46 while being held by the boat 30. Next the boat 30 stands by at a predetermined position until all wafers 14 supported by the boat 30 are cooled (see, S300 of FIG. 23). Next, when the wafer 14 of the boat 30 is cooled to a predetermined temperature, the wafer 14 is unloaded from the boat 30 by the substrate transfer machine 28, and is conveyed to the empty pod 16 which is set to the pod opener 24 to thereby be received therein. Thereafter, the pod 16 in which the wafer 14 is received is conveyed to the pod shelf 22 or the pod stage 18 by the pod conveying device 20. In this manner, a series of operations of the substrate processing apparatus 10 is completed.

Heat Insulating Structure

By the way, at the time of the epitaxial growth described above, the wafer region 43 is maintained at an epitaxial growth temperature of 1,500° C. to 1,800° C., but a temperature of a furnace port 47 of the manifold 46 is raised by strong radiant heat from the wafer region 43 which is at a considerably high temperature. In addition, since a large amount of carrier gas is generally required for the epitaxial growth of SiC, transportation of thermal energy to the furnace port 47 from the wafer region 43 is enormous as described above.

Here, the furnace port 47 includes an opening formed in the manifold 46, for example, a lower end opening (a lower opening of the process chamber), or the gas exhaust port 90a on a side surface.

Therefore, according to the embodiments of the present invention, in order to maintain the furnace port 47 at a heat insulating temperature or lower, a heat insulating region 45 is provided between the wafer region 43 and the furnace port 47. A member provided in the heat insulating region 45 is made of a material capable of withstanding a high temperature of 1,500° C. to 1,800° C. (for example, carbon or the like). Here, heat exchange of the carrier gas at the high temperature is actively performed with the member provided in the heat insulating region 45 while cutting off radiation from the wafer region 43. Therefore, the gas can be sufficiently cooled before the gas reaches the furnace port 47.

As described above, in order to promote the cut-off of the radiation and the heat exchanging of gases and the member, in the present embodiment, a heat exchange system including a heat insulating structure is provided in the heat insulating region 45. Next, the heat exchange system will be described.

Heat Exchange Unit

As shown in FIG. 1, a lower heat insulating unit for suppressing an increase in temperature of the seal member of the lower portion of the process chamber is provided on a lower side of the boat 30. The lower heat insulating unit includes a first heat exchange unit 35 and a second heat exchange unit 36. The first heat exchange unit 35 is provided on the lower portion of the boat 30, for example, directly under the boat 30. The first heat exchange unit 35 supports the boat 30 from the lower side of the boat 30 in the heat insulating region 45 between the wafer region 43 in the process chamber 44 and the furnace port 47, and performs heat exchange with a gas in the process chamber 44, so that it is difficult for heat of the gas to be transmitted to the manifold 46 (furnace port 47). In addition, a heat insulating cylinder 34 is provided in the lower portion of the heat exchange unit 35. The heat insulating cylinder 34 is formed such that a plurality of heat insulating members made of quartz are stacked in a disc shape, so that it is difficult for the radiation heat from the body to be heated 48 as the object to be heated, which will be described below, to be transmitted to the lower portion side (furnace port 47) of the processing passage 40. For example, the heat insulating cylinder 34 includes a plurality of heat insulating members formed in circular disc shapes therein, and reflects the heat radiation in multiple steps using the plurality of heat insulating materials, and thereby heat energy is maintained inside the process chamber 44. In addition, the heat insulating cylinder 34 may be made of a heat-resistant material such as graphite (C), silicon carbide (SiC), or the like, but a temperature of the gas is already lowered sufficiently in the heat exchange units 35 and 36 of the upper side, and thereby it is possible to effectively suppress heat deterioration in a rotation shaft 106 or the like with low heat insulating capability by employing a member (for example, quartz) having higher heat insulating performance for the heat exchange units 35 and 36.

In addition, the second heat exchange unit 36 is provided in the process chamber 44 to form a gap with the first heat exchange unit 35 in the horizontal direction of the first heat exchange unit 35. Therefore, the gas introduced from the gas supply nozzles 61 and 62 is exhausted through the gap between the first and second heat exchange units 35 and 36 via the wafer region 43. In this manner, the second heat exchange unit 36 is provided, and thus a gas flow passage becomes narrower, efficiency of the heat exchange is improved, and heat of the gas is difficult to be transmitted to the manifold 46 (furnace port 47).

The first heat exchange unit 35 and the second heat exchange unit 36 which are provided in the above-described heat insulating region 45 act as a heat exchanger for performing heat exchange between the first heat exchange unit 35 and the second heat exchange unit 36 and the gas, but the first heat exchange unit 35 and the second heat exchange unit 36 also act as a heat insulating unit for heat-insulating the wafer region 43 and the furnace port 47 by configuring both the first heat exchange unit 35 and the second heat exchange unit 36 as a heat insulating member.

On the other hand, according to the present embodiment, it is necessary to protect the furnace port 47 from a large amount of heat radiation from the wafer region 43 by heat-insulating the wafer region 43 and the furnace port 47. In order to improve the heat insulating effect, a heat insulating material with a high heat insulating effect may be used, or a height of the heat insulating unit may be increased in the vertical direction. On the other hand, it is necessary to prevent a large amount of thermal energy from being transported from the wafer region 43 to the furnace port 47 by the gas exhausted from the furnace port 47. In order to efficiently prevent the transportation of the thermal energy, a part of the gas flow passages may be buried with a heat insulating material so that the gas flow passage becomes narrower, and heat exchange of the heat insulating material and the gas may be carried out to thereby draw the heat from the gas.

Therefore, when the first heat exchange unit 35 and the second heat exchange unit 36 horizontally spaced apart from the first heat exchange unit 35 with a gap therebetween are provided, a heat exchange area between the gas and the first and second heat exchange units 35 and 36 may be increased, and a cross-sectional area of the gas flow passage through which the gas passes may be reduced. Here, it is preferable that the gas flow passage be increased in the wafer region 43 in order to improve flow uniformity of the gas. Accordingly, in the present embodiment, the second heat exchange unit 36 is provided at a position lower than that of the wafer region 43, and a horizontal cross-sectional area of the gas flow passages in a region in which the first and second heat exchange units 35 and 36 are provided is reduced compared to a horizontal cross-sectional area of the gas flow passage in the wafer region 43.

As described above, the substrate processing apparatus according to the present embodiment includes the process chamber 44 having an body to be heated 48 as an object to be heated therein and configured to process a plurality of wafers 14; the boat 30 acting as a substrate holder configured to hold the plurality of wafers 14 with an interval therebetween in a vertical direction in the process chamber 44; a first heat exchange unit 35 supporting the boat 30 in the process chamber 44, the first heat exchange unit 35 being configured to perform a heat exchange with a gas in the process chamber 44; a second heat exchange unit 36 provided in the process chamber 44, the second heat exchange unit 36 being horizontally spaced apart from the first heat exchange unit 35 with a gap therebetween and being configured to perform a heat exchange with the gas in the process chamber 44; and the induction coil 50 acting as an induction heating unit configured to subject the body to be heated 48 to an induction heating from an outer side of the body to be heated 48.

By the configuration above, heat exchange of the lower side of the process chamber may be promoted, and heat deterioration or the like of the member of the lower side of the process chamber may be suppressed. In addition, a horizontal size of the process chamber may be sufficiently greater than that of the wafer, and thus productivity may be improved, and uniformity of heat treatment inside and between surfaces of the wafers may be improved.

The first heat exchange unit 35 and the second heat exchange unit 36 may be formed in, for example, a solid columnar shape, but is preferable that they be formed in a hollow cylindrical shape in terms of a heat insulating effect. When the first and second heat exchange units 35 and 36 are formed in the hollow cylindrical shape, it is preferable that the hollow cylinder have a structure in which gas does not flow into the hollow cylinder. In addition, partitioned walls are not formed so that an inside of the hollow cylinder forms a single space, but, based on the fact that partitioned spaces block more radiation heat, it is preferable that a plurality of partitioned walls be formed in the hollow cylinder to thereby form a plurality of partitioned spaces in the vertical direction. In this case, by integrally forming the partitioned wall with the hollow cylinder, the first heat exchange unit 35 and the second heat exchange unit 36 may be integrally formed. In addition, the first heat exchange unit 35 and the second heat exchange unit 36 may be formed separately. When the heat exchange units are formed separately, a plurality of heat exchangers are stacked so as to form the spaces partitioned in the vertical direction, so that the first heat exchange unit or the second heat exchange unit may be configured. The heat exchanger may have a cross-section formed in a quadrangular shape, a "U"-shape, or a "]"-shape.

In addition, when the first heat exchange unit 35 or the second heat exchange unit 36 is formed in the solid columnar shape, a plurality of heat exchange blocks may be stacked in the vertical direction to thereby form the solid columnar shape.

In addition, the first heat exchange unit 35 and the second heat exchange 36 may be composed of a single circular plate or a plurality of circular plates. When the first heat exchange unit 35 and the second heat exchange 36 are composed of the plurality of circular plates, the plurality of circular plates may be stacked in the vertical direction so as to have an interval therebetween in the vertical direction.

A combination in the shapes of the first heat exchange unit 35 and the second heat exchange 36, for example, is considered with the following four cases. A case in which both the heat exchange unit 35 and the second heat exchange 36 are formed in a hollow cylindrical shape, a case in which the second heat exchange unit 36 is formed in a disc shape or a hollow cylindrical shape, a case in which the first heat exchange unit 35 is formed in a hollow cylindrical shape or a disc shape, and a case in which both the heat exchange unit 35 and the second heat exchange 36 are formed in a disc shape. Typically, a combination of the hollow cylindrical shapes and a combination of the circular shapes may be used.

Gas Supply Unit

FIG. 3 is a planar cross-sectional view showing a heat insulating region 45 of a lower side of the process chamber. As described above, the second heat exchange unit 36 is provided in the process chamber 44 to form a gap 33 with the first heat exchange unit 35 in the horizontal direction of the first heat exchange unit 35. The second heat exchange unit 36 has a cross-section formed in a ring shape so as to bury a ring-shaped gas flow passage. In the embodiment shown in FIG. 3, five gas supply units 161 to 165 are centrally disposed on one side of the ring-shaped gas flow passage formed between the body to be heated 48 and the first heat exchange unit 35, and bury a part of the gas flow passage in a fan shape. In addition, the five gas supply units 161 to 165 may be referred to generically as a gas supply unit 160. In this manner, when the gas supply unit 160 is disposed in the heat insulating region 45, the second heat exchange unit 36 is formed in a reverse C-shape to bury the remaining flow passages of the ring-shaped gas flow passages. In this case, the second heat exchange unit 36 is configured to cover the entire region of the heat insulating region 45 excluding the gas supply unit 160 on a horizontal periphery of the first heat exchange unit 35 of the lower side of the boat. In this manner, when the second heat exchange unit 36 covers the entire region excluding the gas supply unit 160 of the horizontal periphery of the first heat exchange unit 35 of the lower side of the boat, it is possible to promote heat exchange in the entire region excluding the gas supply unit 160 of the lower side of the process chamber, and further suppress heat deterioration or the like of the member of the lower side of the process chamber. In addition, the gas supply unit 160 itself may be used as a third heat exchange unit.

Heat Exchange

By the configuration described above, in one process of the manufacturing method of the semiconductor device, the boat that holds each of a plurality of wafers 14 with an interval therebetween in the vertical direction is heated by heating the process chamber 44 having the body to be heated 48 therein by performing induction heating on the body to be heated 48 using the induction coil 50. Further, the plurality of wafers are processed, and at the same time, the first heat exchange unit 35 and the second heat exchange unit 36 being horizontally spaced apart from the first heat exchange unit 35 with a gap therebetween perform a heat exchange with the gas in the process chamber 44.

In this manner, when the first heat exchange unit 35 and the second heat exchange unit 36 perform heat exchange with the gas in the process chamber 44, it is possible to promote heat exchange of a lower side of the process chamber, suppress heat deterioration or the like of the member of the lower side of the process chamber, and configure a horizontal size of the process chamber 44 so as to be sufficiently greater than that of the wafer 14, and thus productivity may be improved, and uniformity of heat treatment inside and between surfaces of the wafers 14 may be improved.

Next, a variety of embodiments for a lower structure of the processing furnace including the heat exchange unit for performing heat exchange with a gas in the process chamber will be described.

First Embodiment

Figure 6:
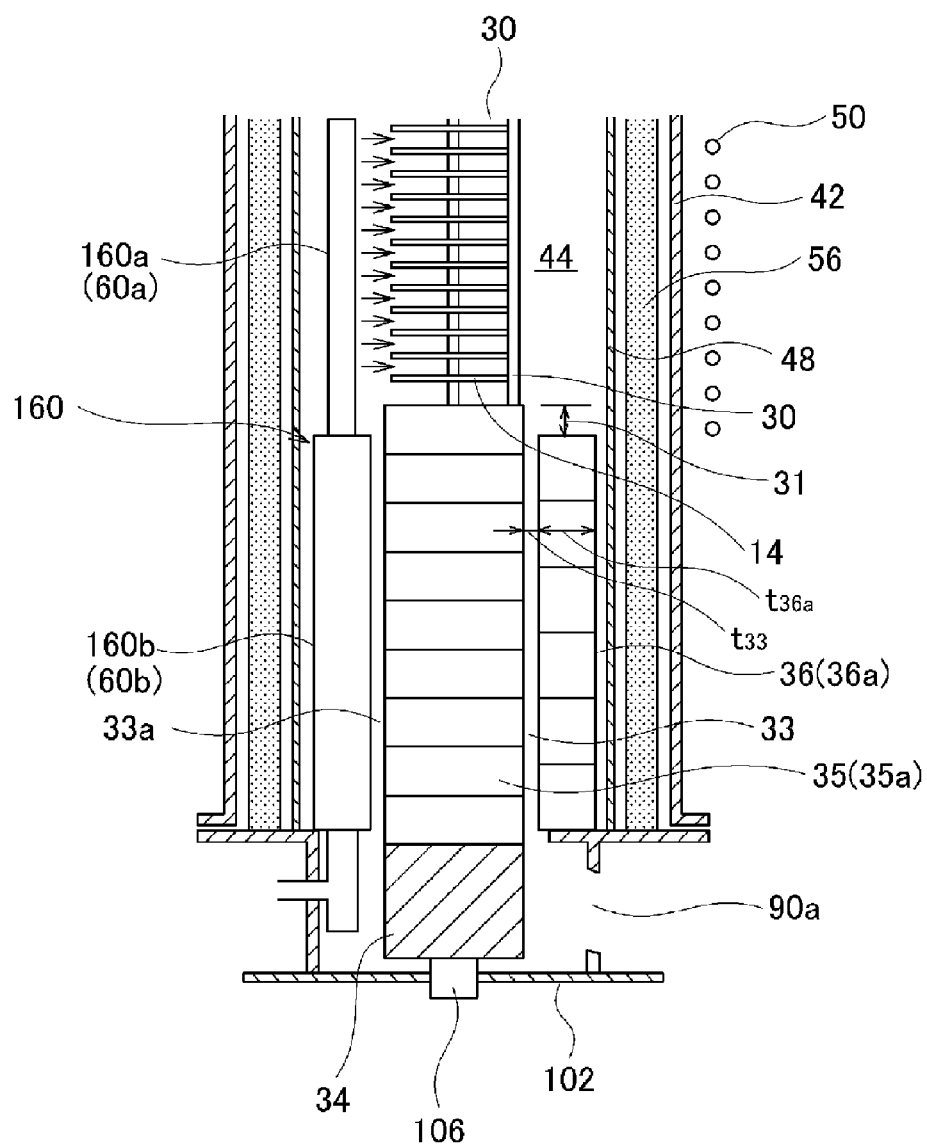
FIG. 6 is a vertical cross-sectional view showing a lower structure of the processing furnace used in the first embodiment of the present invention.
Figure 13:
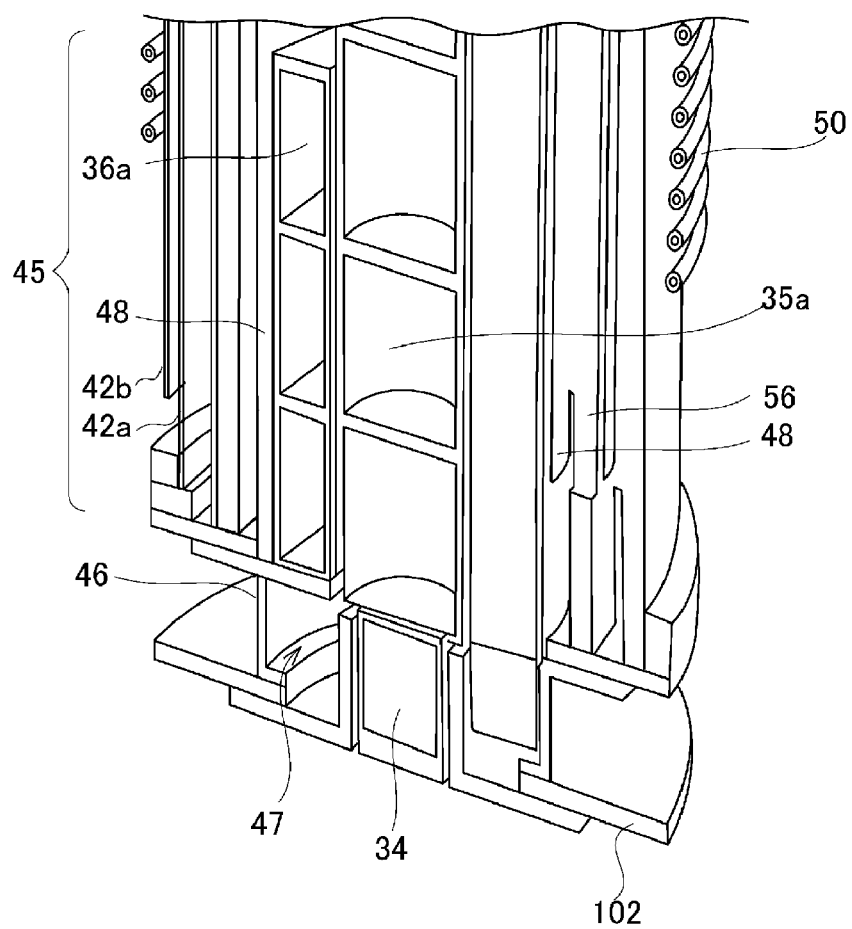
FIG. 13 is a detailed vertical cross-sectional view showing a lower structure of the processing furnace used in the first embodiment of the present invention.

In FIG. 6, a schematic view of the lower structure of the processing furnace according to a first embodiment is shown, and in FIG. 13, a detailed perspective cross-sectional view of the lower structure is shown. In addition, in FIG. 6, a wafer holder 15 is omitted, and the wafer 14 is used instead of the wafer holder.

Hollow Heat Exchange Unit

As shown in FIG. 6, the first heat exchange unit 35 and the heat insulating cylinder 34 are disposed on the lower side of the boat 30. The first heat exchange unit 35 includes a heat exchange unit formed in a hollow cylindrical shape, for example a center heat insulating cylinder 35a composed of a heat insulating member. In the horizontal direction of the center heat insulating cylinder 35a, the second heat exchange unit 36 is disposed to form the gap 33 with the center heat insulating cylinder 35a. The second heat exchange unit 36 includes a heat exchange unit formed in a hollow cylindrical shape, for example, a peripheral edge heat insulating cylinder 36a formed in a reverse C shape when viewed from above (see, FIGS. 8 and 10). In addition, even on the lower side of the gas supply unit 160, a third heat exchange unit is disposed to form a gap 33a with the center heat insulating cylinder 35a in the horizontal direction of the center heat insulating cylinder 35a. The third heat exchange unit includes a heat exchange unit formed in a hollow cylindrical shape, for example, a flow passage heat insulating cylinder 160b. In this manner, when the center heat insulating cylinder 35a and the peripheral edge heat insulating cylinder 36a are formed in the hollow cylindrical shape, an area in which an outer wall of each of the center heat insulating cylinder 35a and the peripheral edge heat insulating cylinder 36a contacts the gas may be increased, heat exchange may be further promoted, and heat deterioration or the like of the member of the lower side of the process chamber may be further suppressed. In addition, the center heat insulating cylinder 35a and the peripheral edge heat insulating cylinder 36a may be easily manufactured. Specifically, when the center heat insulating cylinder 35a and the peripheral edge heat insulating cylinder 36a are made of a carbon material, or the like, it is difficult to manufacture a complex shape due to difficult processing, but easy manufacturing may be realized because the center heat insulating cylinder 35a and the peripheral edge heat insulating cylinder 36a are formed in the hollow cylindrical shape.

Stacked Heat Exchanger

The center heat insulating cylinder 35a, the peripheral edge heat insulating cylinder 36a, and the flow passage heat insulating cylinder 160b which are formed in the hollow cylindrical shape may be formed in such a manner that a plurality of heat exchangers are stacked so as to form a plurality of partitioned spaces in the vertical direction depending on embodiments. In this manner, when the heat exchange unit is formed by laminating a plurality of heat exchangers, a heat insulating capability of the heat exchange unit may be improved by cutting off radiation. In addition, assembly may be made easy, an area in which the outer wall contacts the gas may be easily increased, heat exchange may be further promoted, and heat deterioration or the like of the lower side of the process chamber may be further suppressed. In addition, the heat exchange unit may be readily manufactured. In particular, when the heat exchanger is made of a carbon material or the like, it is difficult to manufacture a complex shape due to difficult processing, but easy manufacturing may be realized because the heat exchange unit is formed in the hollow cylindrical shape.

U-Shaped Cross-Section

Figure 11:
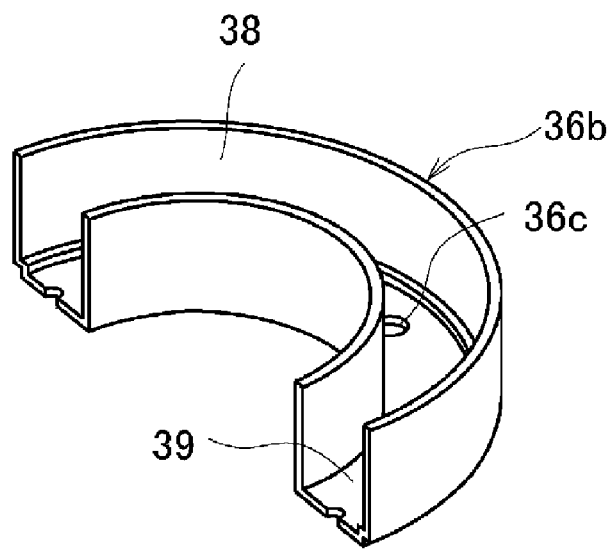
FIG. 11 is a partial perspective view showing the second heat exchange unit of the processing furnace used in the first embodiment of the present invention.

The heat exchanger constituting the peripheral edge heat insulating cylinder 36a by lamination may be formed in a quadrangular cross-sectional duct shape, but in the present embodiment, as shown in FIG. 11, the heat exchanger is formed as a heat exchanger 36b with a U-shaped cross-section, whose upper portion is opened, and a through-hole 36c for discharging atmosphere in a space 38 to the outside of the space 38 is formed on a lower end surface 39. The heat exchanger 36b with the U-shaped cross-section is disposed so that a center portion thereof constitutes the lower end surface 39, and the lower end surface 39 of the stacked heat exchangers 36b of the upper end covers an upper opening surface of the heat exchanger 36b of the lower end. When the heat exchanger 36b is configured in this manner, the atmosphere is discharged through the through-hole 36c even in a case in which atmosphere in the space 38 inside the heat exchanger is thermally expanded, and thus a pressure difference inside/outside the heat exchanger is eliminated, thereby suppressing occurrence of breakage, cracks, or the like of the heat exchanger 36b. In addition, even when the atmosphere in the space 38 is discharged to the outside of the space 38, the through-hole 36c is provided on the lower end surface 39, and thus it is possible to suppress particles, contaminants, or the like from being mixed in the process chamber. In addition, when the heat exchanger 36b positioned on the uppermost end is formed in a duct shape with a quadrangular cross-section, and the through-hole is not provided on the upper surface, preferably, the gas does not flow into the heat exchanger 36.

Figure 12:
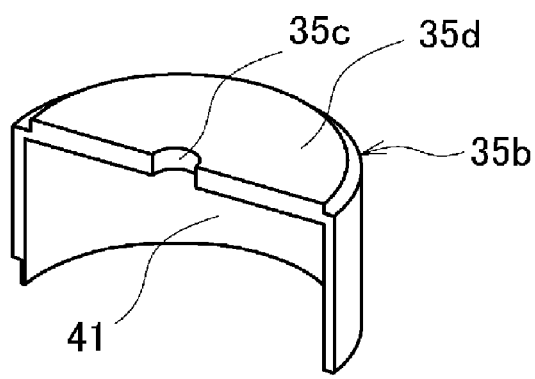
FIG. 12 is a partial perspective view showing a first heat exchange unit of the processing furnace used in the first embodiment of the present invention.

In addition, the heat exchanger constituting the center heat insulating cylinder 35a may be formed as a cylindrical heat exchanger 35b with a bottom as shown in FIG. 12. The cylindrical heat exchanger 35b with the bottom is disposed so that a bottom portion in a posture in which the cylindrical heat exchanger 36b is rotated by 180 degrees constitutes a ceiling surface 35d. On the ceiling surface 35d, a through-hole 35c for discharging atmosphere in a space 41 to the outside of the space 41 is formed. The cylindrical heat exchanger 35b with the bottom is configured in such a manner that the ceiling surface 35d of the stacked heat exchanger 35b of the lower end covers a lower opening surface of the heat exchanger 35b of the upper end. In addition, it is preferable that the through-hole 35c not be provided on the ceiling surface 35d of the heat exchanger 35b positioned at the uppermost end in order to prevent flowing-in of the gas.

Stepped Portion

In addition, a height of the upper end of the center heat insulating cylinder 35a may coincide with a height of the upper end of the peripheral edge heat insulating cylinder 36a, but as shown in FIG. 6, a stepped portion 31 is preferably provided so that the height of the upper end of the peripheral edge heat insulating cylinder 36a is lower than the height of the upper end of the center heat insulating cylinder 35a. In this manner, when the stepped portion 31 in which the height of the upper end of the peripheral edge heat insulating cylinder 36a is lower than the height of the upper end of the center heat insulating cylinder 35a is provided, flow passages of the gas may be ensured in places of the upper end of the peripheral edge heat insulating cylinder 36a, and thus gas may be supplied even to the wafer 14 positioned on the bottom as in the upper wafer 14, a film thickness of the wafer 14 positioned on the bottom may be suppressed from being thinner, and uniformity of heat treatment inside and between surfaces of the wafers 14 may be improved.

Third Heat Exchange Unit

Figure 8:
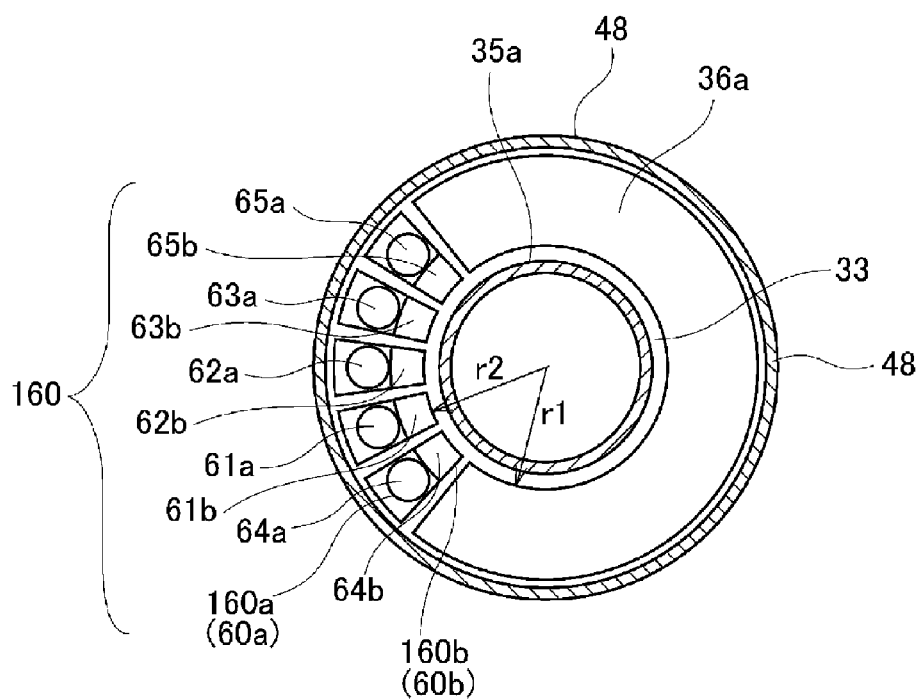
FIG. 8 is a planar cross-sectional diagram showing a lower structure of the processing furnace used in the first embodiment of the present invention.

As shown in FIGS. 6 and 8, the gas supply unit 160 is provided in the process chamber 44. The gas supply unit 160 is configured to supply the gas to the wafer 14 held by the boat 30 in the process chamber 44 in the horizontal direction of the wafer 14. The gas supply unit 160 includes a part that is a lower side and the other part that is an upper side.

The part that is a lower side of the gas supply unit 160 is disposed on a horizontal peripheral edge of the center heat insulating cylinder 35a. The other part that is an upper side of the gas supply unit 160 is disposed on a horizontal peripheral edge of the boat 30. The gas supply unit 160 includes a gas flow passage 160a for discharging the gas, and a flow passage heat insulating cylinder 160b as a flow passage heat exchange unit that is the third heat exchange unit for performing heat exchange with the gas in the process chamber 44. The gas flow passage 160a is disposed so as to extend to the other part of an upper side of the gas supply unit 160 from the part of a lower side of the gas supply unit 160.

The gas is supplied to the wafer 14 which is held by the boat 30 in the process chamber 44, from the gas flow passage 160a constituting the other part that is an upper side of the gas supply unit 160, in the horizontal direction of the wafer 14.

The gas flow passage 160a constituting the part that is a lower side of the gas supply unit 160 is disposed so as to be spaced apart from the center heat insulating cylinder 35a in the horizontal direction. The flow passage heat insulating cylinder 160b is the part that is a lower side of the gas supply unit 160, and provided so as to be closer to the center heat insulating cylinder 35a than the gas flow passage 160a.

As described above, the gas flow passage heat insulating cylinder 160b that is a lower side of the gas supply unit 160 and is the third heat exchange unit is provided so as to be closer to the center heat insulating cylinder 35a than the gas flow passage 160a to form a gap 33a with the center heat insulating cylinder 35a, and performs heat exchange with the gas in the process chamber 44 which flows through the gap 33a.

In this manner, since the flow passage heat insulating cylinder 160b is provided in addition to the peripheral edge heat insulating cylinder 36a on a gas flow passage formed between the body to be heated 48 and the center heat insulating cylinder 35a, heat exchange of the lower side of the gas supply unit 160 may be promoted, and heat deterioration or the like of the member of the lower side of the process chamber may be suppressed. In addition, a horizontal size of the process chamber 44 may be sufficiently greater than that of the wafer 14, and a horizontal flow space of the gas from the gas supply unit 160 may be increased, and thereby a mixed space of the gas may be ensured by the flow of the gas, pre-heating of the gas may be further performed, and uniformity of heat treatment inside and between surfaces of the wafers may be improved.

In particular, when the flow passage heat insulating cylinder 160b that is the third heat exchange unit is provided so as to be closer to the center heat insulating cylinder 35a than the gas flow passage 160a, the entire region of the peripheral edge in the horizontal direction of the center heat insulating cylinder 35a is coated by the peripheral edge heat insulating cylinder 36a and the flow passage heat insulating cylinder 160b. Therefore, the heat exchange may be promoted in the entire region of the lower side of the process chamber, and heat deterioration or the like of the member of the lower side of the process chamber may be further suppressed.

Here, it is preferable that the gas supply nozzle 60a constitute the gas flow passage 160a, and the gas supply nozzle 60a extend to the other part that is an upper side of the gas supply unit 160 from a part that is a lower side thereof. In this case, it is preferable that a plurality of gas supply holes be provided in a part that is an upstream side of the gas supply nozzle 60a, and a gas be supplied to the wafer 14 held by the boat 30 in the process chamber 44 through the gas supply holes, in the horizontal direction.

In addition, when the gas supply nozzle 60a constitutes the gas flow passage 160a, the gas flow passage 160a constitutes only the part that is a downstream side of the gas supply unit 160, and the gas flow passage 160a constituting the other part that is an upstream side of the gas supply unit 160 is used as a simple space communicating with the gas supply nozzle 60a. In this case, it is preferable that the gas be supplied in the horizontal direction to the wafer 14 held by the boat 30 in the process chamber 44 through the space. In this case, the flow passage heat insulating cylinder 160b may be used as the nozzle heat insulating cylinder 60b which is provided so as to be closer to the center heat insulating cylinder 35a than the gas supply nozzle 60a.

In addition, as shown in FIG. 8, a horizontal inner peripheral diameter (r1) of the second heat exchange unit (the peripheral edge heat insulating cylinder 36a) may coincide with a horizontal inner peripheral diameter (r2) of the first heat exchange unit of the nozzle heat insulating cylinder. In this manner, the inner peripheral diameters coincide with each other, and thus a heat transfer route (gap) in which heat transfer action occurs may be reduced in the entire lower side of the process chamber, and heat exchange may be promoted in the entire lower side of the process chamber, thereby further suppressing heat deterioration or the like of the member of the lower side of the process chamber.

Figure 7:
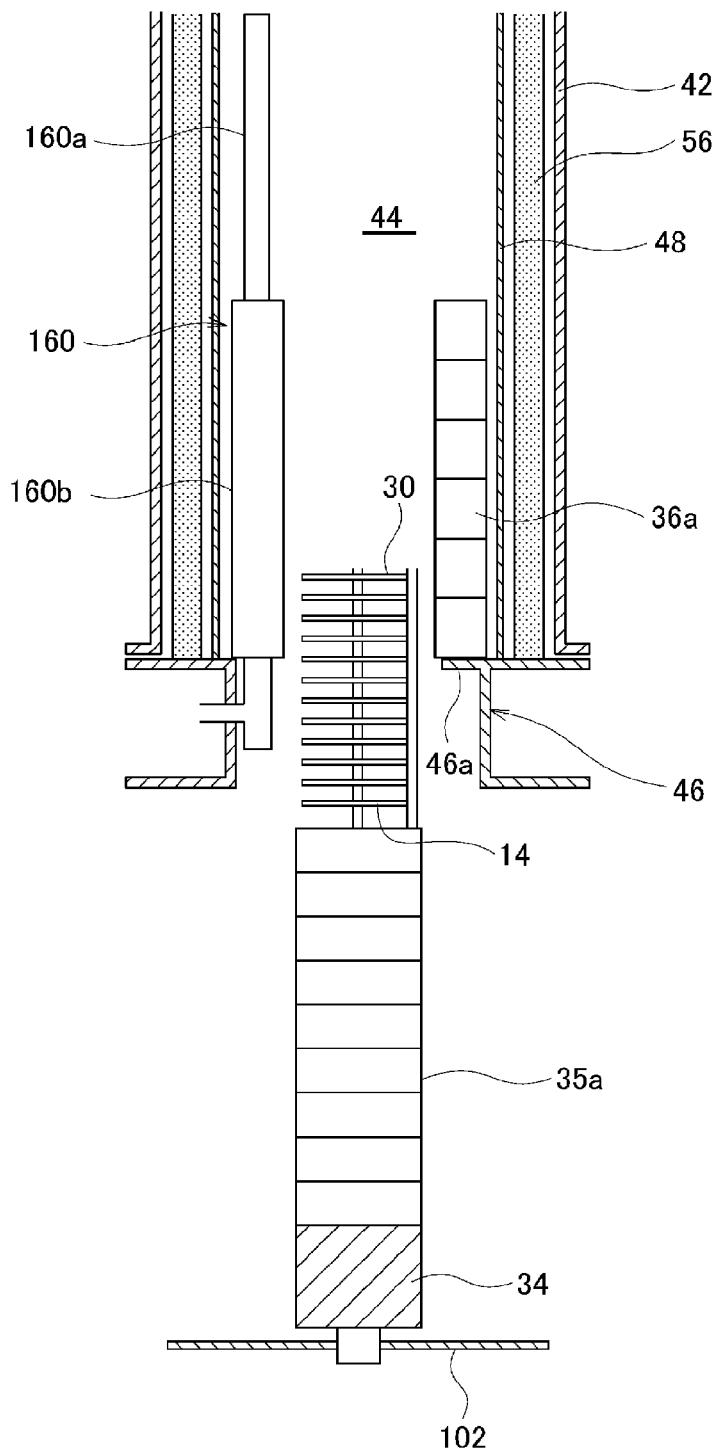
FIG. 7 is a vertical cross-sectional view showing the processing furnace describing loading/unloading of a boat used in the first embodiment of the present invention.
Figure 9:
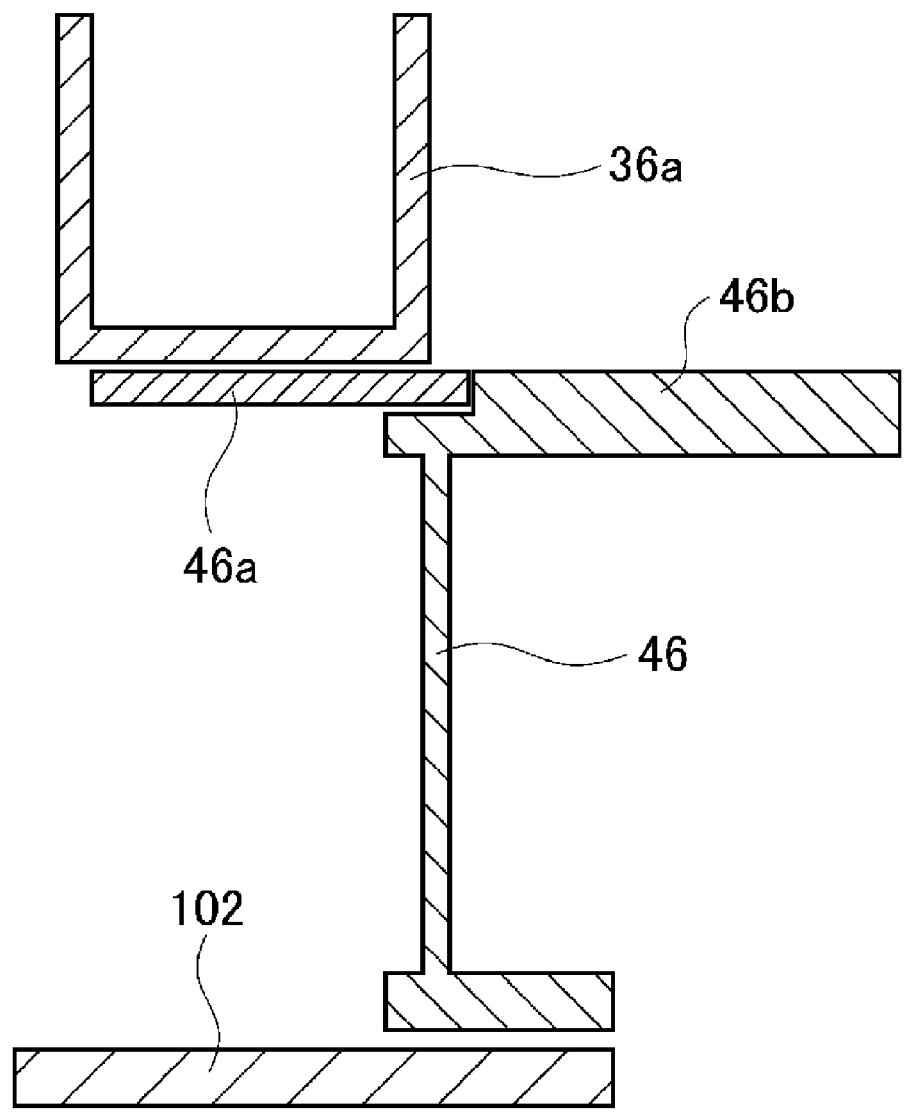
FIG. 9 is a detailed vertical cross-sectional view showing a placing portion of a second heat exchange unit used in the first embodiment of the present invention.
Figure 10:
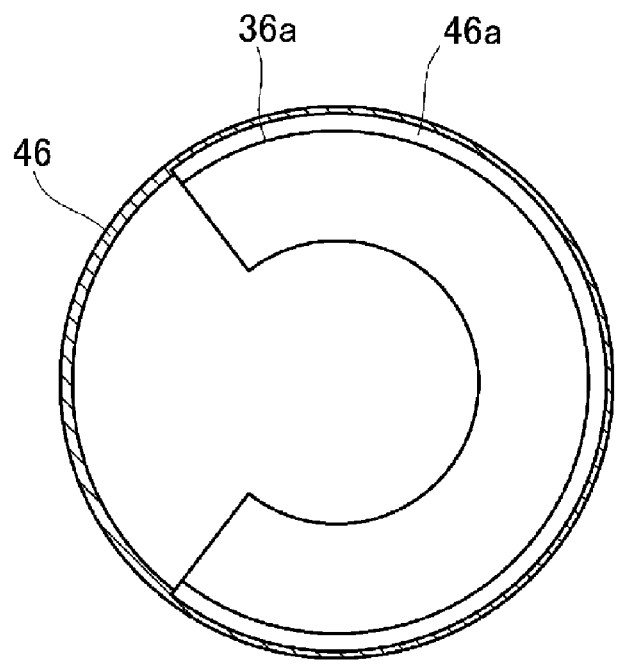
FIG. 10 is a detailed plan view of the placing portion of the second heat exchange unit of the processing furnace used in the first embodiment of the present invention.

In FIGS. 9 and 10, as a preferred example of the first embodiment, a placing portion of the peripheral edge heat insulating cylinder 36a will be described in detail. A reverse C-shaped base 46a excluding the gas supply unit 160 is provided on an upper flange 46b of the manifold 46, and a peripheral edge heat insulating cylinder 36a with a reverse C-shaped cross section is placed on the base 46a. Therefore, since the seal cap 102 is lowered at the time of boat-down, and a member of an upper side from the manifold 46 which is supported by the manifold 46 is left even when the boat 30, the center heat insulating cylinder 35a, and the heat insulating cylinder 34 are loaded into and unloaded from the process chamber, the peripheral edge heat insulating cylinder 36a is left in the furnace (the process chamber) even at the time of loading/unloading of the wafer, as shown in FIG. 7.

In this manner, since the peripheral edge heat insulating cylinder 36a is left in the process chamber even when the boat 30 and the center heat insulating cylinder 35a are loaded into and unloaded from the process chamber, the boat 30 and the center heat insulating cylinder 35a may be easily loaded into and unloaded from the process chamber. In addition, typically, a horizontal size of the process chamber 44 is required to be increased when the peripheral edge heat insulating cylinder 36a is loaded into and unloaded from the process chamber, but in the present embodiment, the peripheral edge heat insulating cylinder 36a is left in the process chamber. As a result, it is unnecessary to increase the horizontal size of the process chamber 44, and thus occurrence of a dead space may be suppressed.

Width of Second Heat Exchange Unit

In addition, as shown in FIGS. 6 and 8, a horizontal width ($t_{36a}$) of the second heat exchange unit (peripheral edge heat insulating cylinder 36a) may be greater than a horizontal size ($t_{33}$) of the gap 33. When configured as above, a heat transfer route (gap) in which a heat transfer action to the lower side of the process chamber communicating with the furnace port 47 is generated may be reduced, heat exchange in the lower side of the process chamber may be promoted, and the heat deterioration or the like of the member of the lower side of the process chamber may be further suppressed.

Position of Exhaust Port

As shown in FIG. 6, a gas exhaust port 90a for exhausting the gas in the process chamber 44 may be provided on a lower side from the first heat exchange unit (center heat insulating cylinder 35a) and the second heat exchange unit (peripheral edge heat insulating cylinder 36a). Thereby, the heat exchange with the gas between the first heat exchange unit (center heat insulating cylinder 35a) and the second heat exchange unit (peripheral edge heat insulating cylinder 36a) can be more reliably promoted.

Action

Hereinafter, an action of the above-described configuration will be described. In one process in the manufacturing method of the semiconductor device, the boat 30 that is fixed onto the seal cap 102 and in which a plurality of SiC wafers 14 are mounted is loaded to the process chamber 44 using the elevation mechanism, and a space of the process chamber is sealed. The space of the process chamber may have a desired pressure using the vacuum exhaust device 86 via the APC valve 84 while introducing an inert gas (for example, Ar or the like) into the furnace. By applying high power (for example, 10 to 100 kHz, 10 to 200 kW) to the induction coil 50 provided on the outer periphery of the process chamber, an eddy current is generated in the cylindrical body to be heated 48, and the body to be heated 48 is heated to a desired processing temperature (1,500° C. to 1,800° C.) by Joule heat. Therefore, the SiC wafer 14, the wafer holder 15, and the boat 30 which are provided on an inner side from the body to be heated 48 are heated at the same temperature as the body to be heated by radiant heat emitted from the body to be heated 48.

In addition, in the vicinity of the lower opening of the process chamber, a temperature is maintained low (about 200° C.) by a lower heat insulating unit (first heat exchange unit to third heat exchange unit) in order to protect the seal member (O ring or the like) from the heat. SiC epitaxial growth is performed while a Si-based source ($SiCl_4$, $SiH_4$, TCS, DCS, or the like in the drawing) and a carbon-based material ($C_3H_8$, $C_2H_4$, or the like) with which a carrier gas is mixed via the gas supply nozzle 60 are supplied to the SiC wafer 14 that is maintained at a processing temperature (1,500° C. to 1,800° C.), and the inside of the process chamber is controlled to have a desired pressure using the APC valve 84. During the growth, rotation by the rotation shaft 106 is performed to ensure uniformity inside the surface of the wafer.

By the configuration described above, in one process of the manufacturing method of the semiconductor device, the boat that holds a plurality of wafers 14 with an interval therebetween in the vertical direction is heated by heating the process chamber 44 having the body to be heated 48 therein by subjecting the body to be heated 48 to an induction heating using the induction coil. Further, the plurality of wafers are processed, and at the same time the first heat exchange unit 35 and the second heat exchange unit 36 being horizontally spaced apart from the first heat exchange unit 35 with a gap therebetween perform heat exchange with the gas in the process chamber 44.

When the first heat exchange unit 35 and the second heat exchange unit 36 perform heat exchange with a gas in the process chamber 44, a temperature of the gas introduced from the lower side of the process chamber may be reduced, and heat deterioration or the like of the member of the lower side of the process chamber may be suppressed. In addition, by providing the second heat exchange unit 36 on the lower side of the wafer region 43, a horizontal size of the process chamber 44 may be sufficiently greater than that of the wafer 14, and thus uniformity of heat treatment inside and between surfaces of the wafers 14 may be improved.

Simulation

Figure 14:
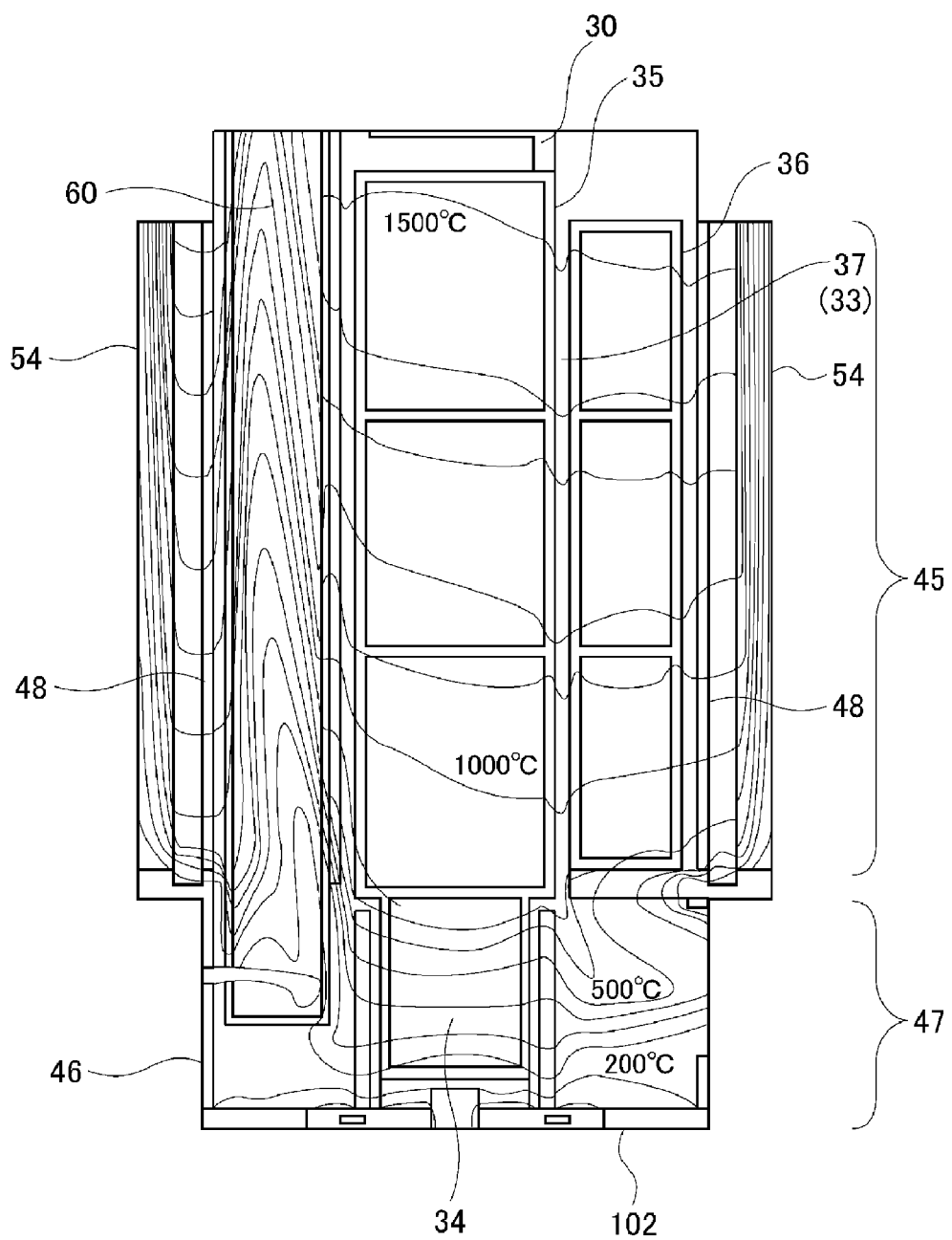
FIG. 14 is a vertical cross-sectional view showing a lower structure of the processing furnace used in the first embodiment of the present invention, and an explanatory view showing calculation results of a temperature distribution in a case in which there is a heat exchange unit outside a lower side of a boat, and a gas flow passage is narrow.
Figure 15:
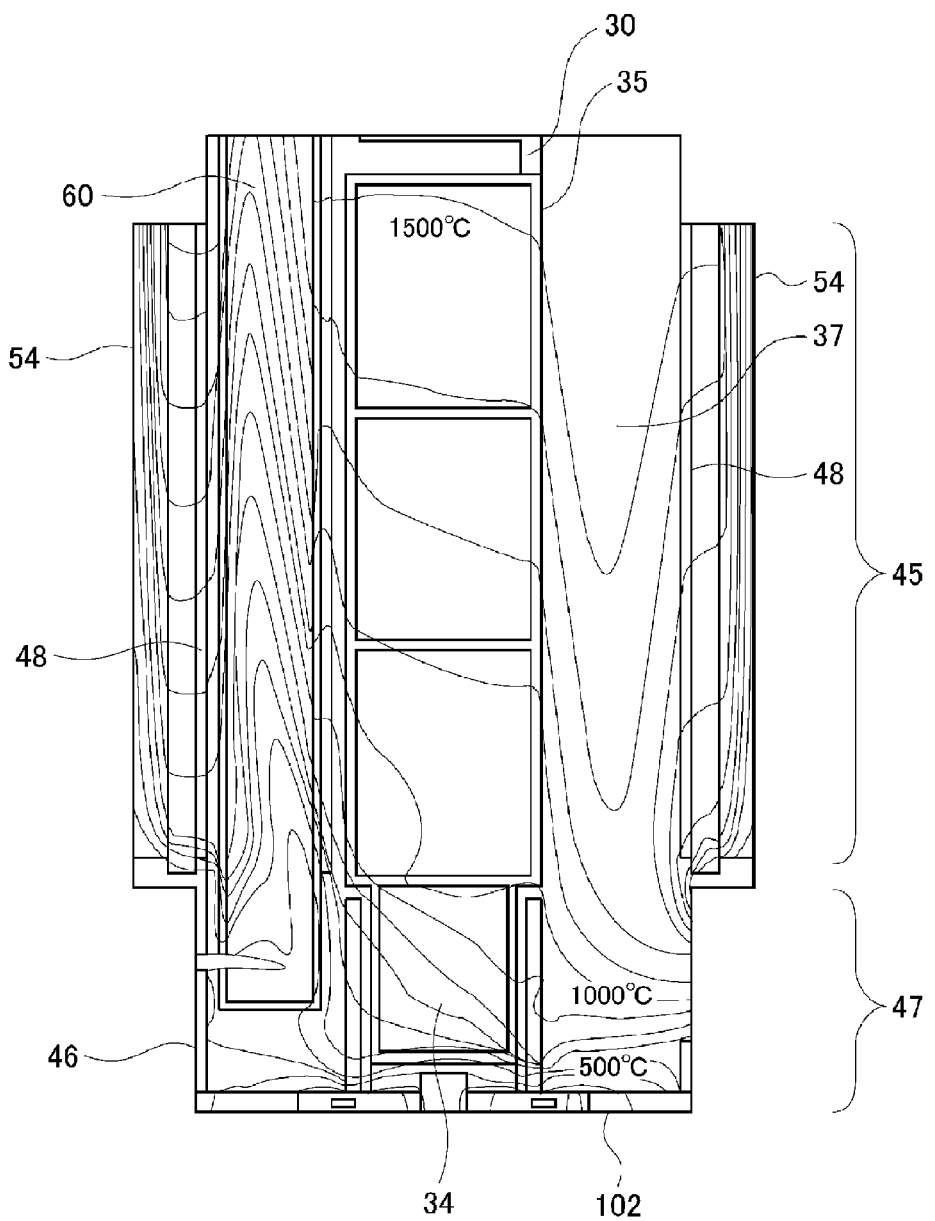
FIG. 15 is a vertical cross-sectional view showing a lower structure of a processing furnace used in Comparative example, and an explanatory view showing calculation results of a temperature distribution in a case in which there is no heat exchange unit outside a lower side of a boat, and a gas flow passage is wide.

Effects when a passage through which a gas passes (flow passage of gas) is narrowed by the second heat exchange unit 36 will be described using a simulation. Calculation results of a temperature distribution when a heat insulating material other than the first heat exchange unit 35 below the boat 30 and the heat insulating cylinder 34 is absent and the flow passage 36 of the gas is wide are shown in FIG. 15, and calculation results of a temperature distribution when the flow passage 37 (gap 33) is narrow due to provision of the second heat exchange unit 36 are shown in FIG. 14. Since the epitaxial growth temperature of SiC is 1,500° C. to 1,800° C., a temperature of the wafer region 43 is set to 1,600° C., and a temperature other than the processing furnace is set to room temperature. In addition, an isotherm is shown up to 1,500° C. for convenience.

As can be seen from FIGS. 14 and 15, when the flow passage 37 is wide, a carrier gas reaches the furnace port 47 in a state in which a temperature of the carrier gas is at a high temperature, and thus a temperature of the furnace port 47 is significantly increased to 500° C. to 1,000° C. However, when the flow passage 37 is narrowed by the second heat exchange unit 36, heat exchange between the carrier gas and the peripheral member is promoted, and thus the temperature of the gas is sufficiently reduced to 200° C. to 500° C. before the gas reaches the furnace port 47, thereby maintaining the temperature of the furnace port 47 low. In this manner, since the temperature of the furnace port 47 is maintained below a heat insulating temperature (for example, about 300° C.) of the O ring and a heat insulating temperature (for example, about 100° C.) of a magnetic fluid, the O ring and the magnetic fluid can be protected. This will be described below.

A quantity of heat exchanged by the gas and the peripheral member in the flow passage 37 is represented by the following Equation (1).

$$Q=A_1 h(T_g-T_w) \quad (1)$$

(Q: quantity of heat, $A_1$: heat exchange area, h: heat transfer coefficient, $T_g$: gas temperature, and $T_w$: wall temperature)

In addition, variation in the gas temperature by the quantity of heat which has been exchanged is represented by the following Equation (2).

$$T_g^{n+1}=T_w^n-Q/A_2 u\rho C_p \quad (2)$$

($A_2$: flow passage area, u: flux velocity, ρ: density, and $C_p$: specific heat)

From Equation (1), in order to increase the quantity of heat which has been exchanged, the heat exchange area $A_1$ (an area where the gas contacts the member) is required to be increased. In addition, in order to significantly reduce the temperature of the gas by the quantity of heat which has been exchanged, a flow passage area $A_2$ (a cross-sectional area of the flow passage 37 through which the gas passes) may be reduced.

Accordingly, an increase in the heat exchange area may be realized by providing the peripheral edge heat insulating cylinder 36a on the horizontal peripheral edge of the center heat insulating cylinder 35a. In addition, in order to reduce the flow passage area, the gap 33 between the center heat insulating cylinder 35a and the peripheral edge heat insulating cylinder 36a may be reduced as much as possible.

In a case in which the heat exchange unit is not formed in a cylindrical shape, and has a structure in which disc-shaped heat insulating plates are stacked in parallel in a vertical direction, heat radiation is reflected by a plurality of heat insulating plates, and thus effects of cutting off the radiation are great. However, since the entire peripheral surface of the circular plate is not the heat exchange area, the heat exchange area of the heat exchange unit which is not formed in the cylindrical shape is slightly reduced compared to the cylindrical heat exchange unit when viewed from a viewpoint of the heat exchange area. From this viewpoint, when a flow rate of the carrier gas is increased, the cylindrical heat exchange unit becomes advantageous due to the increased heat exchange area. In the present embodiment, the cut-off of the radiation as well as the heat exchange between the gas and the member are required to be promoted, and thus effects of cutting off the radiation should be maintained to some extent even in the cylindrical shape. Accordingly, in the present embodiment, the second heat exchange unit is configured as a peripheral edge heat insulating cylinder formed in a hollow cylindrical shape by laminating a plurality of the heat exchangers with a U-shaped cross-section.

Effects of Embodiments

In the present embodiment, one or more effects listed in the following example are obtained.

(1) In the present embodiment, the substrate processing apparatus includes a process chamber having an object to be heated therein and configured to process a plurality of substrates; a boat configured to hold the plurality of substrates with an interval therebetween in a vertical direction from a lower side in the process chamber; a center heat insulating cylinder supporting the boat in the process chamber, the center heat insulating cylinder being configured to perform a heat exchange with a gas in the process chamber; a peripheral edge heat insulating cylinder provided in the process chamber, the peripheral edge heat insulating cylinder being horizontally spaced apart from the center heat insulating cylinder with a gap therebetween and being configured to perform a heat exchange with the gas in the process chamber; and an induction coil configured to subject the body to be heated to an induction heating from an outer side of the body to be heated.

In this manner, by providing the peripheral edge heat insulating cylinder to form a gap in the vertical direction of the center heat insulating cylinder, radiation occurring due to the induction heat is cut-off, and heat exchange with the gas of the lower side of the process chamber is promoted, thereby maintaining a temperature of the member of the lower side of the process chamber at a heat insulating temperature or lower. Accordingly, heat deterioration or the like of the member of the lower side of the process chamber may be suppressed. In addition, by providing the peripheral edge heat insulating cylinder in the horizontal direction of the center heat insulating cylinder in the process chamber, a horizontal size of the process chamber may be sufficiently greater than that of the wafer, and thus a gas is reliably supplied between the wafers. As a result, productivity may be improved, and uniformity of heat treatment inside and between surfaces of the wafers may be improved. In addition, heat transportation from the lower side of the process chamber is effectively prevented by the heat exchange, and thus a gas with a large flow rate flows into the process chamber, and correspondence to the process of a high temperature (for example, at least 1,500° C.) is easily made.

(2) The substrate processing apparatus further includes a gas supply unit configured to horizontally supply the gas to each of the plurality of the wafers held by the boat in the process chamber, wherein the gas supply unit includes: a gas supply nozzle having a lower side thereof horizontally spaced apart from a horizontal peripheral edge of the center heating insulating cylinder and being configured to horizontally supply the gas to each of the plurality of wafers held by the boat in the process chamber through an upper side thereof; and a nozzle heat insulating cylinder disposed at the lower side of the gas supply unit closer to the center heating insulating cylinder than the gas supply nozzle and being configured to perform a heat exchange with the gas in the process chamber.

Accordingly, heat exchange of the lower side of the process chamber may be promoted, and heat deterioration or the like of the member of the lower side of the process chamber may be suppressed. In addition, a horizontal size of the process chamber may be sufficiently greater than that of the wafer, and a horizontal flow space of the gas from the gas supply unit may be increased, and thereby a mixed space of the gas may be ensured, pre-heating of the gas may be further performed, and uniformity of heat treatment inside and between surfaces of the wafers may be improved.

(3) An upper end of the peripheral edge heat insulating cylinder is lower than that of the center heat insulating cylinder. Accordingly, a flow passage of the gas may be ensured in places of the upper end of the peripheral edge heat insulating cylinder, and thus uniformity of heat treatment inside and between surfaces of the wafers which are placed on the bottom of the boat may be improved.

(4) When the second heat exchange unit is formed in a cylindrical shape, an area in which an outer wall of the cylindrical shape contacts the gas may be increased, heat exchange may be further promoted, and heat deterioration or the like of the member of the lower side of the process chamber may be further suppressed. In addition, the second heat exchange unit may be readily manufactured. In particular, when the second heat exchange unit is made of a carbon material or the like, it is difficult to manufacture a complex shape due to difficult processing, but easy manufacturing may be realized because the second heat exchange unit is formed in a cylindrical shape. In addition, when the second heat exchange unit is formed in a hollow cylindrical shape instead of a solid columnar shape, heating of the furnace port may be preferably reduced by heat conduction. In addition, the heat insulating plate is horizontally provided in the hollow portion, and thereby it is possible to suppress even heat transfer due to radiation.

(5) In the manufacturing method of the semiconductor device according to the present embodiment, the boat that holds each of a plurality of wafers with an interval therebetween in the vertical direction is heated by heating the process chamber having the body to be heated therein by subjecting the body to be heated to an induction heating using the induction coil. Further, the plurality of wafers are processed, and the center heat insulating cylinder and the peripheral edge insulating cylinder being horizontally spaced apart from the center heating insulating cylinder perform heat exchange with gas in the process chamber. Accordingly, the heat exchange of the lower side of the process chamber may be promoted, and heat deterioration or the like of the member of the lower side of the process chamber may be suppressed. In addition, since the horizontal size of the process chamber is sufficiently greater than that of the wafer, productivity may be improved, and uniformity of heat treatment inside and between surfaces of the wafers may be improved.

(6) In addition, the entire region of the horizontal peripheral edge of the center heat insulating cylinder is covered by the peripheral edge heat insulating cylinder and the gas supply unit, and thereby heat exchange may be promoted in the entire region of the lower side of the process chamber, and heat deterioration or the like of the member of the lower side of the process chamber may be suppressed.

(7) In addition, when a horizontal inner circumference of the peripheral edge heat insulating cylinder coincides with a horizontal inner circumference of the center heat insulating cylinder, a heat transfer route (gap) in which heat transfer action to the lower side of the process chamber occurs may be reduced in the entire lower side of the process chamber, heat exchange may be promoted in the entire lower side of the process chamber, and heat deterioration or the like of the member of the lower side of the process chamber may be further suppressed.

(8) In addition, when a width of the peripheral edge heat insulating cylinder is greater than the gap, the heat transfer route (gap) in which the heat transfer action to the lower side of the process chamber occurs may be reduced, heat exchange in the lower side of the process chamber may be promoted, and heat deterioration or the like of the member of the lower side of the process chamber may be further suppressed.

(9) In addition, when the peripheral edge heat insulating cylinder is formed in such a manner that a plurality of heat exchangers are stacked so as to form a plurality of partitioned spaces in the vertical direction, a heat insulating capability of the peripheral edge heat insulating cylinder may be improved. In addition, assembly may be made easy, an area in which the outer wall contacts the gas may be easily increased, heat exchange may be further promoted, and heat deterioration or the like of the lower side of the process chamber may be further suppressed. In addition, the heat exchange unit may be readily manufactured. In particular, when the heat exchange unit is made of a carbon material or the like, for example, it is difficult to manufacture a complex shape due to difficult processing, but easy manufacturing may be realized because the heat exchange unit is formed in the hollow cylindrical shape.

(10) In addition, when the heat exchanger has a cross-section formed in a "]" shape, and a through-hole for discharging atmosphere in a space to the outside of the space is formed on the lower end surface, for example, even when the atmosphere in the space in the heat exchanger is thermally expanded, occurrence of breakage, cracks, or the like of the peripheral edge heat insulating cylinder may be suppressed because the atmosphere is discharged from the through-hole. In addition, even when the atmosphere in the space is discharged to the outside of the space, the through-hole is provided on the lower end surface, and thus it is possible to suppress particles, contaminants, or the like from being mixed in the process chamber.

(11) In addition, since the peripheral edge heat insulating cylinder remains in the process chamber even when the boat and the center heat insulating cylinder are loaded into and unloaded from the process chamber, the boat and the center heat insulating cylinder can be easily loaded into and unloaded from the process chamber. In addition, when the peripheral edge heat insulating cylinder is loaded into and unloaded from the process chamber, the horizontal size of the process chamber is required to be increased more, but it is unnecessary to increase the horizontal size of the process chamber more because the peripheral edge heat insulating cylinder is left in the process chamber, thereby suppressing generation of a dead space.

Second Embodiment

Figure 16:
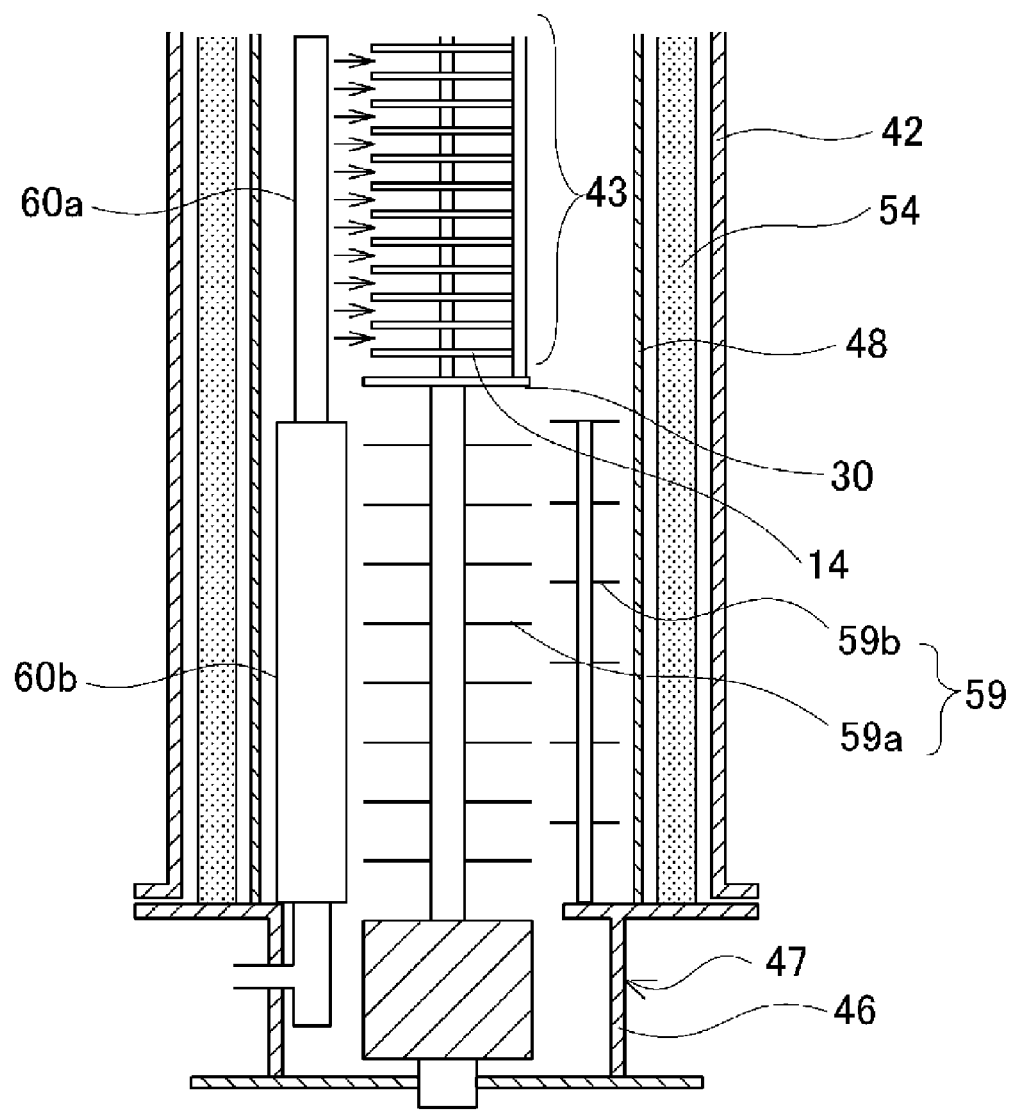
FIG. 16 is a vertical cross-sectional view showing a lower structure of a processing furnace used in a second embodiment of the present invention.
Figure 17:
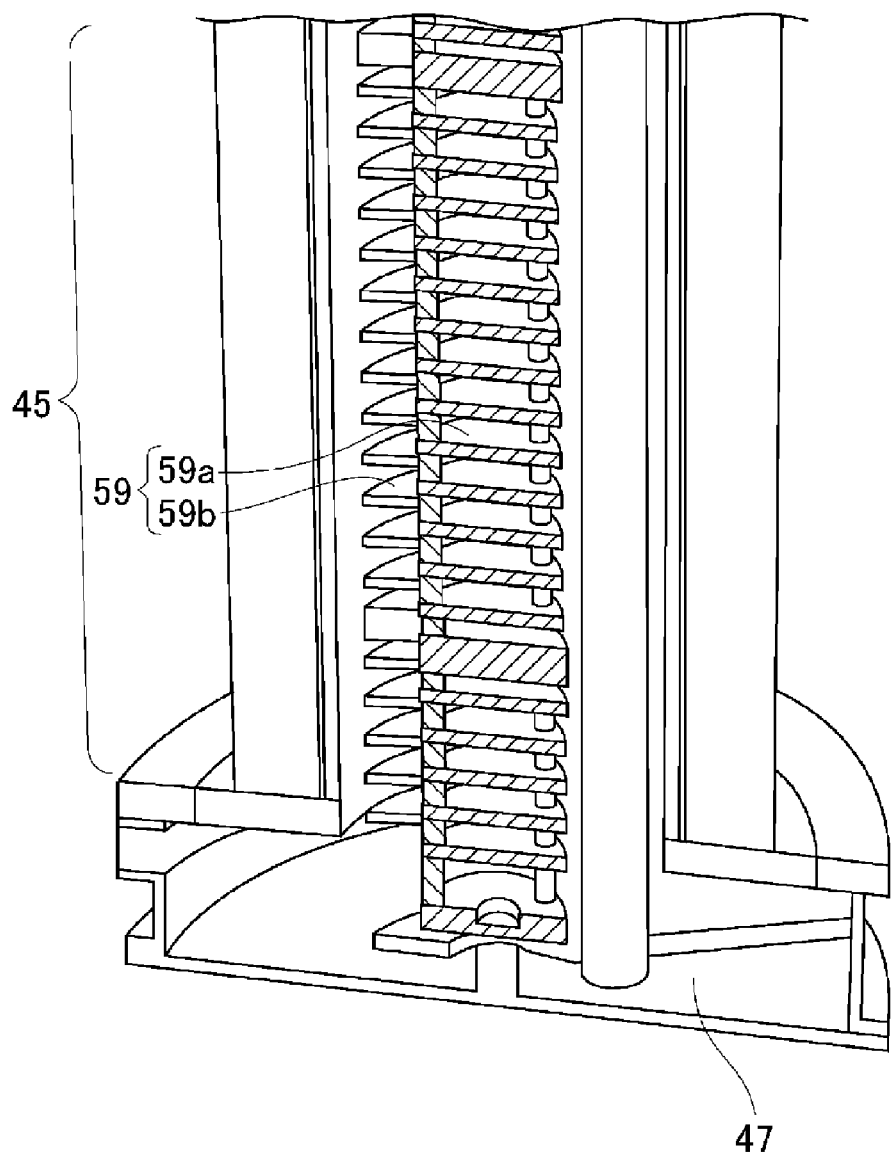
FIG. 17 is a detailed vertical cross-sectional view showing a lower structure of the processing furnace used in the second embodiment of the present invention.

In FIGS. 16 and 17, a second embodiment in which the heat exchanger constituting the first and second heat exchange units is configured as a heat insulating plate is shown. That is, instead of the heat exchange unit formed in the hollow cylindrical shape or the stacked heat exchangers, a plurality of heat insulating plates 59 are provided. As the heat insulating plate 59, a heat insulating plate 59a formed in a disc shape is used in the first heat exchange unit, and a heat insulating plate 59b formed in a ring plate shape is used in the second heat exchange unit. In order to cut off radiation of a high temperature from the wafer region 43, the heat insulating plate 59 is preferably used because effects become higher as the number of the heat insulating plates 59 is increased. However, when a process gas with a large flow rate is required, heat that is transmitted to the outside of the furnace by the gas as well as radiation should be considered. Heat exchange is required to be actively performed in the heat exchange unit until the gas which is at a high temperature reaches the furnace port 47, but when the heat exchange unit is the heat insulating plate 59, a heat exchange area of a furnace axial direction that is a main-stream of the gas flow is reduced compared to the heat exchange unit formed in the hollow cylindrical shape, and thereby heat exchange of the gas may be slightly reduced. Accordingly, the heat insulating plate 59 of the present embodiment may be effective when cutting off the radiation preferentially than when stopping a large amount of heat transportation preferentially.

Third Embodiment

Figure 18:
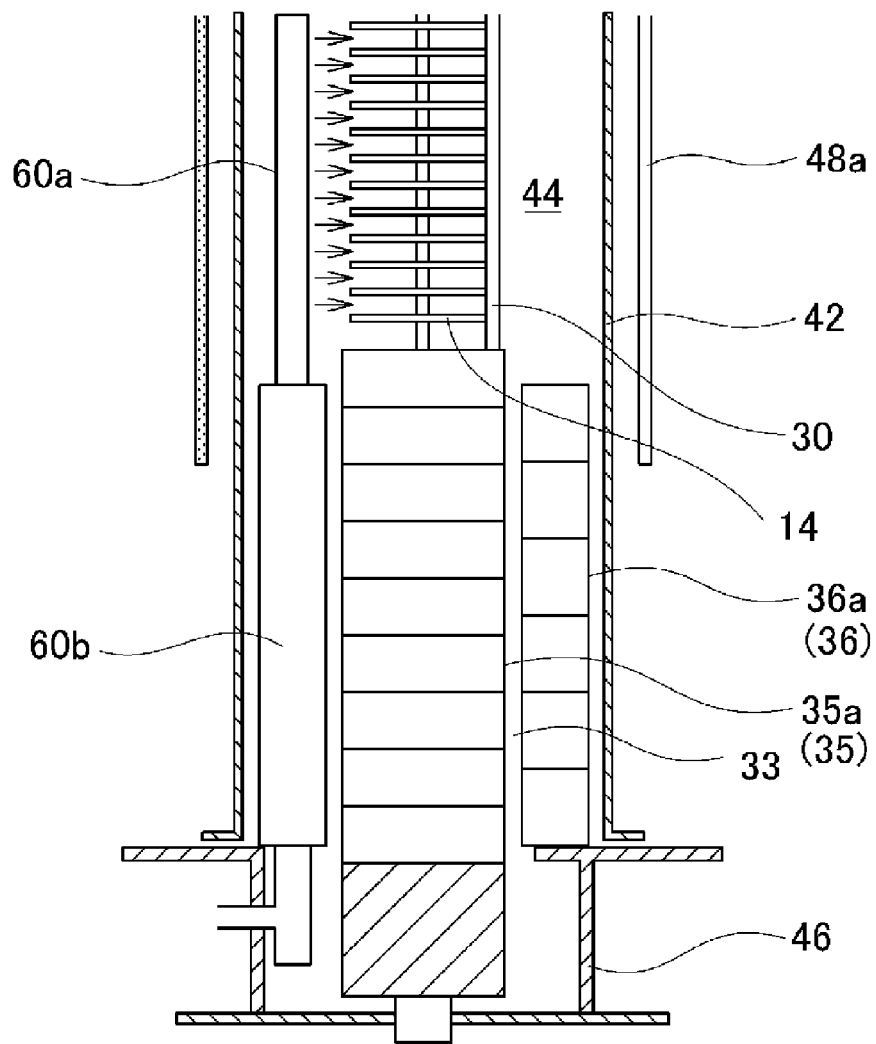
FIG. 18 is a vertical cross-sectional view showing a lower structure of a processing furnace according to a third embodiment of the present invention.

In FIG. 18, a processing furnace of the third embodiment in which the substrate heating unit is configured as a resistance heating body instead of an induction heating body composed of the above-described induction coil and the object to be heated is shown.

Unlike the processing furnace shown in FIG. 16, the processing furnace shown in FIG. 18 does not require an induction heating member such as the body to be heated 48, the outer heat insulating wall 56, the induction coil 50, or the like. As shown in FIG. 18, the processing furnace is formed in a reaction vessel including the reaction tube 42 made of quartz and the manifold 46, and includes the process chamber 44 for processing the wafers 14, a resistance heating heater 48a that is provided on the outer periphery of the reaction tube 42 and acts as a heating body for heating the wafer 14 in the process chamber 44, and a boat 30 that holds the plurality of wafers 14 in the process chamber 44 to have an interval with each other in the vertical direction.

In this manner, the first and second heat exchange units that cut off radiation and promote heat exchange between gas and the member may be applied even to the processing furnace which is configured to heat the wafer 14 by resistance heating from the outside of the reaction tube 42. Specifically, in the processing furnace described above, the center heat insulating cylinder 35a acting as the first heat exchange unit that holds the boat 30 in the process chamber 44 and performs heat exchange with gas in the process chamber 44, and the peripheral edge heat insulating cylinder 36a acting as the second heat exchange unit that is provided in the process chamber to form a gap 33 with the center heat insulating cylinder 35a in the horizontal direction of the center heat insulating cylinder 35a and performs heat exchange with the gas in the process chamber 44 are provided.

In the present embodiment, the induction heating member in which the number of parts is increased is not required, and only a resistance heating heater is provided, thereby simplifying a configuration of the processing furnace. In addition, since the wafer 14 is heated from the outside of the reaction tube 42, the reaction tube 42 may be required to be formed of a member which can withstand a high temperature of at least 1,500° C., for example, made of a carbon material when performing a high temperature treatment of, for example, at least 1,500° C. with respect to the wafer 14.

Fourth Embodiment

Figure 19:
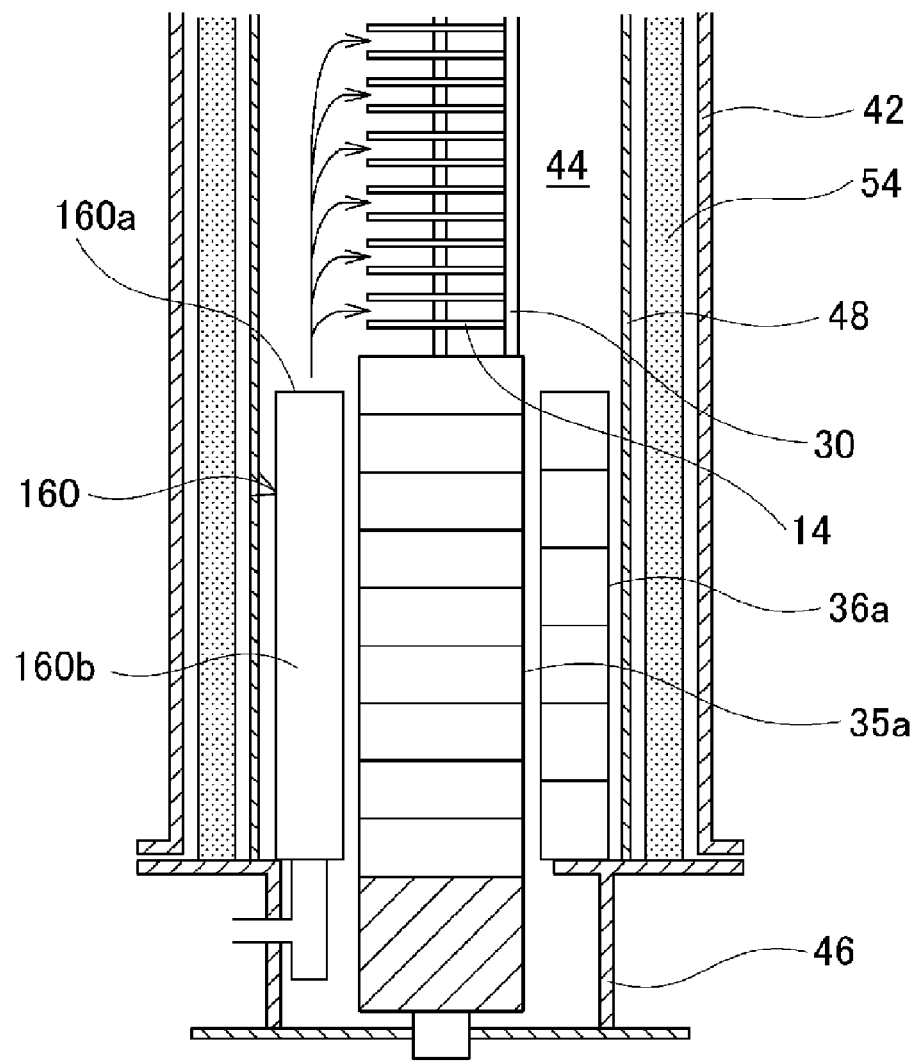
FIG. 19 is a vertical cross-sectional view showing a lower structure of a processing furnace used in a fourth embodiment of the present invention.

In FIG. 19, a processing furnace of a fourth embodiment in which the gas supply unit 160 is modified is shown. A difference between the processing furnace of the present embodiment and the processing furnace of FIG. 6 is that the gas flow passage constituting the other part that is an upper side of the gas supply unit 160 is configured with a space, and the gas supply nozzle 160a is left in an upper end portion of a nozzle heat insulating portion 60b without extending to the side of the wafer 14, that is, the horizontal direction of the boat 30. Common ground between the present embodiment and the embodiment of FIG. 6 is that a part that is a lower side of the gas supply unit 160 for supplying a gas to the wafer 14 held by the boat 30 in the process chamber in the horizontal direction with respect to the wafer 14 is disposed on the horizontal peripheral edge of the center heat insulating cylinder 35a acting as the first heat exchange unit, the gas supply nozzle 160a acting as the gas flow passage constituting the part that is a lower side of the gas supply unit 160 is disposed so as to be spaced apart from the center heat insulating cylinder 35a in the horizontal direction, and the nozzle heat insulating cylinder 60b acting as the flow passage heat exchange unit that is the part that is a lower side of the gas supply unit and performs heat exchange with a gas in the process chamber 44 so as to be closer to the center heat insulating cylinder 35a acting as the first heat exchange unit than the gas supply nozzle 160a is provided.

Accordingly, in the present embodiment, a gas is supplied from a tip of the gas supply nozzle 160a constituting the part that is a lower side of the gas supply unit 160 to the wafer 14 held by the boat 30 in the process chamber 44 in the horizontal direction with respect to the wafer 14. In this manner, in the present embodiment in which the gas supply nozzle 160a is left in an upper end portion of the nozzle heat insulating cylinder 60b to thereby supply the gas from the lower side instead of using the gas supply nozzle that extends to the side of the wafer in the process chamber 44, it is difficult to control flow of the gas between the wafers when the gas is supplied to the wafer 14 stacked in a plurality of layers compared to when the gas supply nozzle extends to the side of the wafer in the process chamber 44 to thereby supply the gas from the upper side, but there is an advantage that blockage or the like of the gas supply nozzle becomes smaller.

Fifth Embodiment

Figure 20:
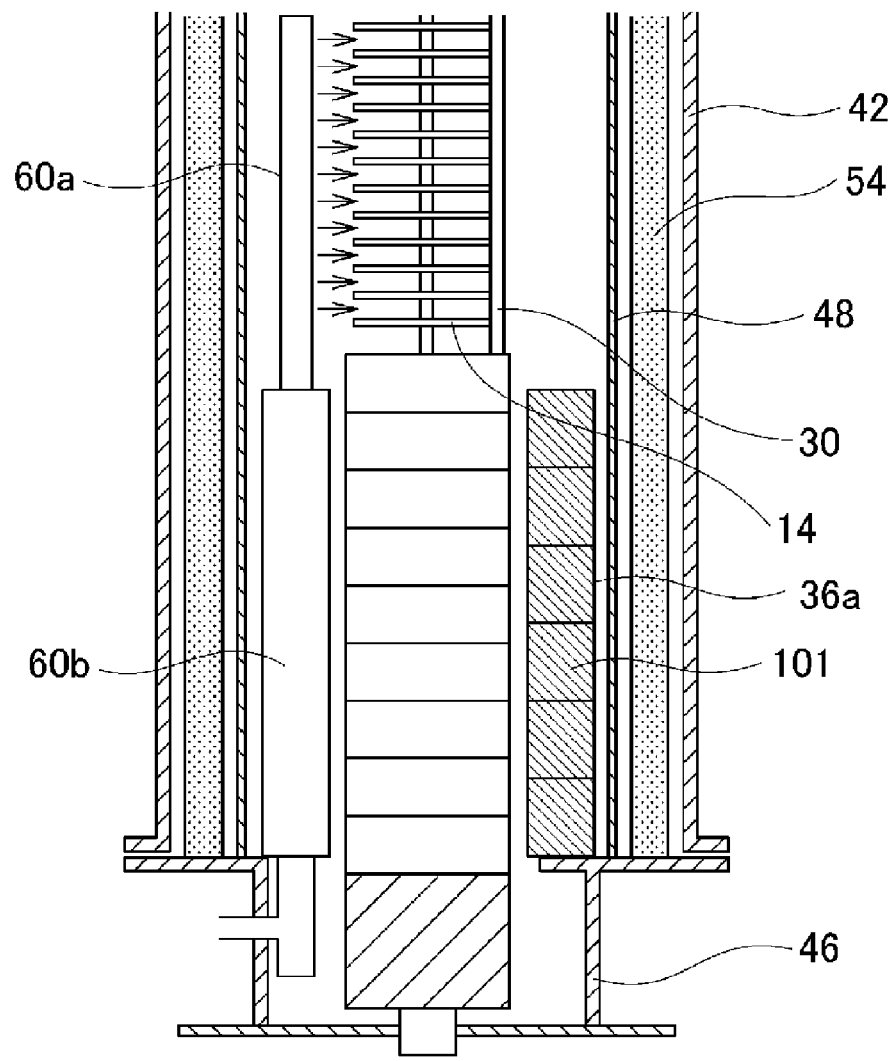
FIG. 20 is a vertical cross-sectional view showing a lower structure of a processing furnace used in a fifth embodiment of the present invention.

In FIG. 20, a processing furnace according to a fifth embodiment including the second heat exchange unit in which a space in the peripheral edge heat insulating cylinder 36a formed in a hollow cylindrical shape is made solid is shown. In the present embodiment, in order to make the space of the inside of the peripheral edge heat insulating cylinder 36a solid, the inside of the peripheral edge heat insulating cylinder 36a is filled with a heat insulating material, for example, a heat insulating felt 101. In this case, when using a member made of carbon or the like instead of quartz in a high temperature field in which quartz cannot be used for the peripheral edge heat insulating cylinder 36a, carbon cannot contain the heat insulating felt 101 inside the peripheral edge heat insulating cylinder 36a by welding unlike quartz. Therefore, in the present embodiment, there are problems in that a gas degassed from the heat insulating felt 101 affects the process or causes particles, heat insulating capability is reduced over time due to deterioration in the heat insulating felt 101 by the process gas, and the like, but there is an advantage in that heat insulating effect is increased compared to the peripheral edge heat insulating cylinder 36a formed in a hollow cylindrical shape.

Sixth Embodiment

Figure 21:
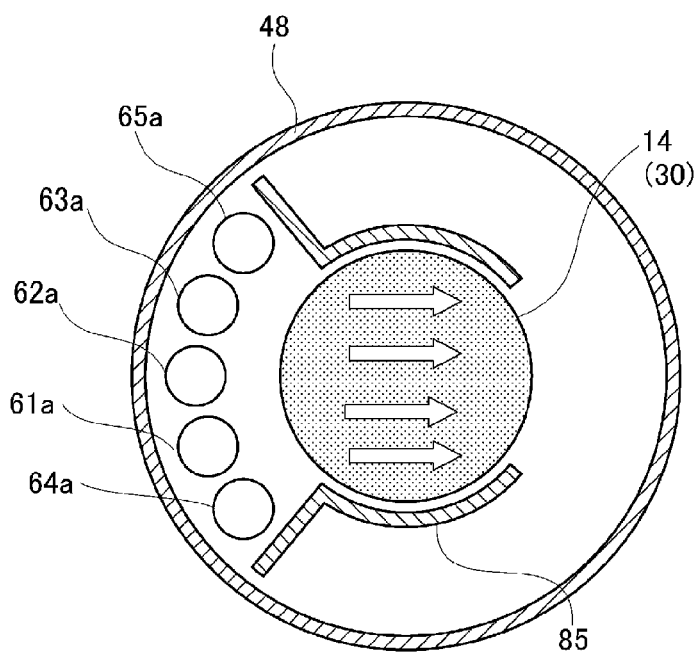
FIG. 21 is a planar cross-sectional view showing a lower structure of a processing furnace used in a sixth embodiment of the present invention.

In FIG. 21, a planar cross-sectional view of a processing furnace according to a sixth embodiment including a regulation unit 85 that regulates the flow of the gas between the wafers 14 is shown. The regulation unit 85 is composed of a pair of thin plates made of a heat insulating material, for example, quartz, and laterally provided toward the boat 30. On an inner periphery of the body to be heated 48 of both ends of a plurality of gas supply nozzles 61a to 65a whose ends are arranged in a circular arc, a pair of regulation units 85 are disposed. The pair of regulation units 85 extend from the inner peripheral side of the body to be heated 48 inward in the radial direction, and are bent in a direction in which the pair of regulation units 85 are mutually opened in a position closer to the boat 30. In addition, the pair of regulation units 85 extend so as to surround a part of the boat 30 along the outer periphery of the boat 30, so that the other end of the regulation unit 85 is in a rear side of the boat. The regulation unit 85 is placed on the second heat exchange unit 36. The pair of regulation units 85 surrounding the boat 30 control the horizontal and vertical flow of the gas from the gas supply nozzle 60a. In the horizontal control by the regulation unit 85, the gas is effectively supplied to the surface of the wafer, and in the vertical control, the gas is evenly supplied between surfaces of the wafer, thereby improving uniformity of the epitaxial layer between the surfaces of the wafer.

Figure 22:
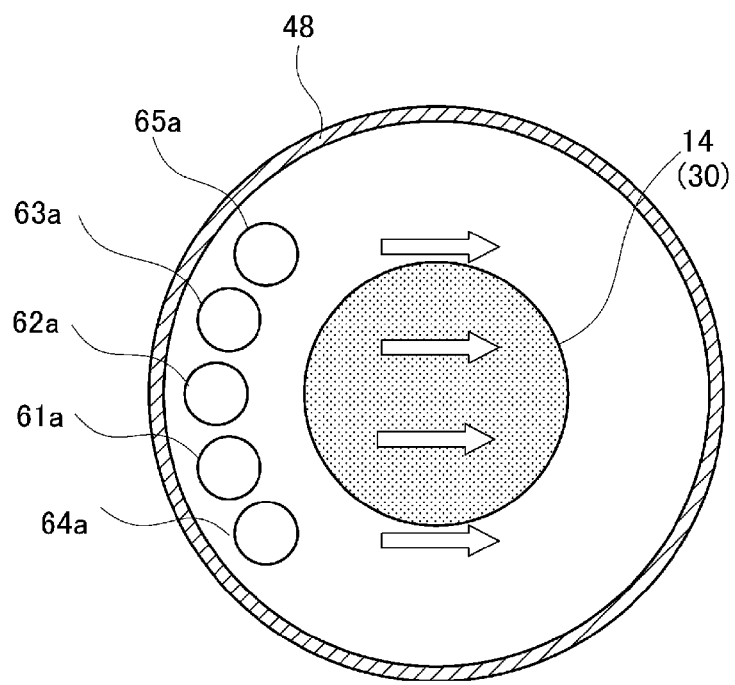
FIG. 22 is a planar cross-sectional view showing a lower structure of a processing furnace used in Comparative example of a sixth embodiment of the present invention.

In addition, in Comparative example shown in FIG. 22, the regulation unit 85 shown in FIG. 21 is not provided, and the gas is supplied from the gas supply nozzles 61a to 65a to the wafer 14.

In the present embodiment, since the regulation unit 85 for regulating the flow of the gas between the wafers 14 is provided, the gas may flow more parallel to the surfaces of the stacked wafers 14 compared to Comparative example in which the regulation unit is not provided, and uniformity of heat treatment inside and between the surfaces of the wafer may be improved.

Other

In addition to this, a variety of modifications of the present invention may be implemented without departing from the scope of the present invention, and the following modifications are possible.

For example, one or a plurality of hollow structures with high heat resistance and low thermal conductivity, for example, a glassy carbon or the like, are stacked and provided on the heat insulating region 45 under the boat and in the vicinity of the boat.

Otherwise, the heat insulating structure provided in the heat insulating region excluding under the boat is placed on the metal manifold 46 of the furnace port 47, and the manifold 46 is cooled by cooling water so as to be sufficiently cooled until the gas reaches the furnace port 47.

Otherwise, a heat insulating structure is configured in such a manner that the flow of the gas of the heat insulating region 45 is controlled, the gas is induced between a heat insulating unit (heat insulating structure) and the body to be heated 48, and the gas is cooled more by the cooled manifold 46.

Supplementary Note

Hereinafter, the preferred embodiments of the present invention are appended.

According to an embodiment of the present invention, there is provided a substrate processing apparatus including: a process chamber having an object to be heated therein and configured to process a plurality of substrates; a substrate holder configured to hold the plurality of substrates with an interval therebetween in a vertical direction in the process chamber; a first heat exchange unit supporting the substrate holder from a lower side thereof in the process chamber, the first heat exchange unit being configured to perform a heat exchange with a gas in the process chamber; a second heat exchange unit provided in the process chamber, the second heat exchange unit being horizontally spaced apart from the first heat exchange unit with a gap therebetween and being configured to perform a heat exchange with the gas in the process chamber; and an induction heating unit configured to subject the object to be heated to an induction heating from an outer side of the object to be heated.

Preferably, the substrate processing apparatus further includes a gas supply unit configured to horizontally supply the gas to each of the plurality of the substrates held by the substrate holder in the process chamber wherein the gas supply unit includes: a gas flow passage having a lower side thereof horizontally spaced apart from a horizontal peripheral edge of the first heat exchange unit and being configured to horizontally supply the gas to each of the plurality of substrates held by the substrate holder in the process chamber through an upper side thereof; and a flow passage heat exchange unit disposed at the lower side of the gas supply unit closer to the first heat exchange unit than the gas flow passage and being configured to performs a heat exchange with the gas in the process chamber.

In addition, preferably, an upper end of the second heat exchange unit is lower than that of the first heat exchange unit.

In addition, preferably, the second heat exchange unit has a hollow cylindrical shape.

In addition, preferably, the second heat exchange unit and the flow passage heat exchange unit cover an entirety of a horizontal peripheral edge of the first heat exchange unit.

In addition, preferably, a horizontal inner circumference of the second heat exchange unit coincides with an inner circumference of the flow passage heat exchange unit closer to the first heat exchange unit.

In addition, preferably, a width of the second heat exchange unit is greater than the gap.

In addition, preferably, the second heat exchange unit includes a plurality of heat exchangers stacked vertically to form a plurality of partitioned spaces.

In addition, preferably, a cross-section of each of the plurality of heat exchangers has a "U" shape, and each of the plurality of heat exchangers includes a through-hole disposed at a lower end surface thereof to release atmosphere in the partitioned spaces to an outside thereof.

In addition, preferably, the second heat exchange unit remains in the process chamber when the substrate holder and the first heat exchange unit are loaded into or unloaded from the process chamber.

In addition, preferably, the substrate processing apparatus further includes an exhaust port disposed lower than the first heat exchange unit and the second heat exchange unit, the exhaust port being configured to exhaust the gas in the process chamber.

According to another embodiment of the present invention, there is provided a method of manufacturing a semiconductor device, including: loading a substrate holder holding a plurality of substrates with an interval therebetween in a vertical direction into a process chamber having an object to be heated therein with a first heat exchange unit supporting the substrate holder; performing a heat exchange with a gas in the process chamber by a second heat exchange unit being horizontally spaced apart from the first heat exchange unit with a gap therebetween while heating the plurality of substrates by subjecting the object to be heated to an induction heating using an induction heating unit to process the plurality of substrate; and unloading the substrate holder from the process chamber.

According to still another embodiment of the present invention, there is provided a substrate processing apparatus, including: a process chamber configured to process a plurality of substrates; a heating body configured to heat the plurality of substrates in the process chamber; a substrate holder configured to hold the plurality of substrates with an interval therebetween in a vertical direction in the process chamber; a first heat exchange unit supporting the substrate holder in the process chamber, the first heat exchange unit being configured to perform a heat exchange with a gas in the process chamber; and a second heat exchange unit provided in the process chamber, the second heat exchange unit being horizontally spaced apart from the first heat exchange unit with a gap therebetween and being configured to perform a heat exchange with the gas in the process chamber.

What is claimed is:

1. A substrate processing apparatus comprising:
a process chamber having an object to be heated therein and configured to process a plurality of substrates;
a substrate holder configured to hold the plurality of substrates with an interval therebetween in a vertical direction in the process chamber;
a first heat exchange unit supporting the substrate holder from a lower side thereof in the process chamber, the first heat exchange unit having a wall configured to perform a heat exchange with a gas for processing the substrates in the process chamber;

a second heat exchange unit provided in the process chamber, the second heat exchange unit having a wall that is horizontally spaced apart from and facing the wall of the first heat exchange unit to form a horizontal gap therebetween in the process chamber and being configured to perform a heat exchange with the gas in the process chamber;

an induction heating unit configured to subject the object to be heated to an induction heating from an outer side of the object to be heated; and an exhaust port disposed lower than the first heat exchange unit and the second heat exchange unit walls, the exhaust port being configured to exhaust the gas in the process chamber, wherein the facing walls of the first and second heat exchange units are each configured to contact the gas as the gas passes from the substrate holder to the exhaust port through the horizontal gap in the process chamber so as to promote the heat exchanges.

2. The substrate processing apparatus according to claim 1, the apparatus further comprising a gas supply unit configured to horizontally supply the gas to each of the plurality of the substrates held by the substrate holder in the process chamber wherein the gas supply unit includes: a gas flow passage having a lower side thereof horizontally spaced apart from a horizontal peripheral edge of the first heat exchange unit and being configured to horizontally supply the gas to each of the plurality of substrates held by the substrate holder in the process chamber through an upper side thereof; and a flow passage heat exchange unit in the process chamber disposed at the lower side of the gas supply unit closer to the first heat exchange unit than the gas flow passage and being configured to perform a heat exchange with the gas in the process chamber.

3. The substrate processing apparatus according to claim 2, wherein the second heat exchange unit and the flow passage heat exchange unit cover an entirety of a horizontal peripheral edge of the first heat exchange unit.

4. The substrate processing apparatus according to claim 3, wherein a horizontal inner circumference of the second heat exchange unit coincides with an inner circumference of the flow passage heat exchange unit closer to the first heat exchange unit.

5. The substrate processing apparatus according to claim 1, wherein an upper end of the second heat exchange unit is lower than that of the first heat exchange unit.

6. The substrate processing apparatus according to claim 1, wherein the second heat exchange unit has a hollow cylindrical shape.

7. The substrate processing apparatus according to claim 1, wherein a width in a horizontal direction of the second heat exchange unit is greater than the gap.

8. The substrate processing apparatus according to claim 1, wherein the second heat exchange unit includes a plurality of heat exchangers stacked vertically to form a plurality of partitioned spaces.

9. The substrate processing apparatus according to claim 8, wherein a cross-section of each of the plurality of heat exchangers has a "U" shape, and each of the plurality of heat exchangers includes a through-hole disposed at a lower end surface thereof to release atmosphere in the partitioned spaces to an outside thereof.

10. The substrate processing apparatus according to claim 1, wherein the second heat exchange unit remains in the process chamber when the substrate holder and the first heat exchange unit are loaded into or unloaded from the process chamber.

11. The substrate processing apparatus according to claim 1, wherein the first and second heat exchange units are configured to perform the respective heat exchanges with the gas in the gap so that a first temperature of the gas at an exhaust port is less than a second temperature of the gas at the substrates.

12. The substrate processing apparatus of claim 1, wherein the walls of the first and second heat exchange units each extend in the vertical direction above the exhaust port and face each other across the horizontal gap.

13. A substrate processing apparatus, comprising:
a process chamber configured to process a plurality of substrates;
a heating body disposed outside of the processing chamber and configured to heat the plurality of substrates in the process chamber;
a substrate holder configured to hold the plurality of substrates with an interval therebetween in a vertical direction in the process chamber;
a first heat exchange unit supporting the substrate holder in the process chamber, the first heat exchange unit being configured to perform a heat exchange with a gas for processing the substrates in the process chamber;
a second heat exchange unit provided in the process chamber, the second heat exchange unit being horizontally spaced apart from and facing the first heat exchange unit a horizontal a gap therebetween in the process chamber and being configured to perform a heat exchange with the gas in the process chamber, wherein each of the first heat exchange unit and the second heat exchange unit comprises a plurality of heat insulating plates arranged vertically with an interval therebetween; and
an exhaust port disposed lower than the first heat exchange unit and the second heat exchange unit walls, the exhaust port being configured to exhaust the gas in the process chamber,
wherein the first and second heat exchange units are each configured to contact the gas as the gas passes from the substrate holder to the exhaust port through the horizontal gap in the process chamber so as to promote the heat exchanges.

* * * * *